(12) United States Patent
Huisman et al.

(10) Patent No.: US 11,175,593 B2
(45) Date of Patent: Nov. 16, 2021

(54) ALIGNMENT SENSOR APPARATUS FOR PROCESS SENSITIVITY COMPENSATION

(71) Applicants: ASML Netherlands B.V., Veldhoven (NL); ASML Holding N.V., Veldhoven (NL)

(72) Inventors: Simon Reinald Huisman, Eindhoven (NL); Tamer Mohamed Tawfik Ahmed Mohamed Elazhary, New Canaan, CT (US); Yuxiang Lin, Wilton, CT (US); Vu Quang Tran, Norwalk, CT (US); Sebastianus Adrianus Goorden, Eindhoven (NL); Justin Lloyd Kreuzer, Trumbull, CT (US); Christopher John Mason, Newtown, CT (US); Igor Matheus Petronella Aarts, Port Chester, NY (US); Krishanu Shome, Cheshire, CT (US); Irit Tzemah, Norwalk, CT (US)

(73) Assignees: ASML Netherlands B.V., Veldhoven (NL); ASML Holding N.V., Veldhoven (NL)

(*) Notice: Subject to any disclaimer, the term of this patent is extended or adjusted under 35 U.S.C. 154(b) by 0 days.

(21) Appl. No.: 17/049,707

(22) PCT Filed: Apr. 3, 2019

(86) PCT No.: PCT/EP2019/058335
§ 371 (c)(1),
(2) Date: Oct. 22, 2020

(87) PCT Pub. No.: WO2019/206586
PCT Pub. Date: Oct. 31, 2019

(65) Prior Publication Data
US 2021/0132509 A1 May 6, 2021

Related U.S. Application Data

(60) Provisional application No. 62/795,174, filed on Jan. 22, 2019, provisional application No. 62/662,976, filed on Apr. 26, 2018.

(51) Int. Cl.
*G03F 9/00* (2006.01)
*G03F 7/20* (2006.01)

(52) U.S. Cl.
CPC ...... *G03F 7/70633* (2013.01); *G03F 7/70191* (2013.01); *G03F 7/70625* (2013.01); *G03F 7/70641* (2013.01); *G03F 9/7088* (2013.01)

(58) Field of Classification Search
CPC ............. G03F 7/70633; G03F 7/70191; G03F 7/70625; G03F 7/70641; G03F 9/7088
(Continued)

(56) References Cited

U.S. PATENT DOCUMENTS 6,297,876 B1 10/2001 Bornebroek
6,961,116 B2 11/2005 Den Boef et al.
(Continued)

FOREIGN PATENT DOCUMENTS

EP      1 628 164 A2      2/2006
WO   WO 2018/041440 A1   3/2018

OTHER PUBLICATIONS

International Search Report and Written Opinion of the International Searching Authority directed to related International Patent Application No. PCT/EP2019/058335, dated Jul. 25, 2019; 10 pages.
(Continued)

*Primary Examiner* — Hung Nguyen
(74) *Attorney, Agent, or Firm* — Sterne, Kessler, Goldstein & Fox P.L.L.C.

(57) ABSTRACT

An alignment sensor apparatus includes an illumination system, a first optical system, a second optical system, a
(Continued)

detector system, and a processor. The illumination system is configured to transmit an illumination beam along an illumination path. The first optical system is configured to transmit the illumination beam toward a diffraction target on a substrate. The second optical system includes a first polarizing optic configured to separate and transmit an irradiance distribution. The detector system is configured to measure a center of gravity of the diffraction target based on the irradiance distribution outputted from a first polarization branch and a second polarization branch. The processor is configured to measure a shift in the center of gravity of the diffraction target caused by an asymmetry variation in the diffraction target and determine a sensor response function of the alignment sensor apparatus based on the center of gravity shift.

38 Claims, 15 Drawing Sheets

(58) Field of Classification Search
USPC .................................. 355/52, 53, 55, 67–71
See application file for complete search history.

(56) References Cited

U.S. PATENT DOCUMENTS

| | | |
|---|---|---|
| 7,511,799 B2 | 3/2009 | Tel et al. |
| 8,706,442 B2 | 4/2014 | Mos et al. |
| 2009/0195768 A1 | 8/2009 | Bijnen et al. |
| 2012/0062863 A1 | 3/2012 | Bijnen et al. |
| 2015/0176979 A1 | 6/2015 | Mathijssen et al. |
| 2015/0227061 A1 | 8/2015 | Tinnemans et al. |
| 2015/0234290 A1* | 8/2015 | Mathijssen ............ G01B 11/14 355/67 |
| 2015/0316490 A1 | 11/2015 | Amit et al. |
| 2015/0355554 A1* | 12/2015 | Mathijssen ........... G03F 9/7092 355/67 |
| 2016/0223920 A1* | 8/2016 | Tinnemans .......... G01B 11/272 |
| 2016/0290796 A1 | 10/2016 | Levy et al. |
| 2017/0023867 A1 | 1/2017 | Staals et al. |
| 2018/0231900 A1 | 8/2018 | Tinnemans |
| 2018/0252514 A1 | 9/2018 | Pandev et al. |

OTHER PUBLICATIONS

International Preliminary Report on Patentability directed to related International Patent Application No. PCT/EP2019/058335, dated Oct. 27, 2020; 7 pages.

Huijbregtse et al., "Overlay Performance with Advanced ATHENA™ Alignment Strategies," Proc. SPIE, vol. 5038, Metrology, Inspection, and Process Control for Microlithography XVII, Jun. 2, 2003; pp. 918-928.

Niu, et al., "Specular Spectroscopic Scatterometry in DUV Lithography," Proc. SPIE, vol. 3677, Metrology, Inspection, and Process Control for Microlithography XIII, Jun. 14, 1999; 10 pages.

Raymond et al., "Multiparameter grating metrology using optical scatterometry," Journal of Vacuum Science & Technology B: Microelectronics and Nanometer Structures Processing, Measurement, and Phenomena, vol. 15, No. 2, 1997; pp. 361-368.

\* cited by examiner

ALIGNMENT SENSOR APPARATUS FOR PROCESS SENSITIVITY COMPENSATION

CROSS-REFERENCE TO RELATED APPLICATIONS

This application claims priority of U.S. Provisional Patent Application No. 62/662,976, which was filed on Apr. 26, 2018, and U.S. Provisional Patent Application No. 62/795,174, which was filed on Jan. 22, 2019, both of which are incorporated herein in their entirety by reference.

FIELD

The present disclosure relates to alignment apparatuses and systems, for example, alignment sensor apparatuses for lithographic apparatuses and systems.

BACKGROUND

A lithographic apparatus is a machine that applies a desired pattern onto a substrate, usually onto a target portion of the substrate. A lithographic apparatus may be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers may be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

Fabrication tolerances continue to tighten as semiconductor devices become ever smaller and more elaborate. Hence, there is a need to continue to improve metrology measurements. One exemplary use of scatterometers is for critical dimension (CD) metrology, which is particularly useful for measuring in patterned structures, such as semiconductor wafers. Optical CD metrology techniques include on dome scatterometry, spectral reflectometry, and spectral ellipsometry. All these techniques are based on measuring the reflected intensity of differently polarized light for different incident directions. Such techniques require a high extinction ratio, or purity of polarization. A polarizing beamsplitter (PBS) divides light by polarization state to transmit p-polarized light while reflecting s-polarized light. Though a perfect PBS transmits 100% of the p-polarization and reflects 100% s-polarization, a real PBS transmits and reflects mixtures of s-polarized light and p-polarized light. The ratio between the p-polarized light and s-polarized light is called the extinction ratio. Optical CD requires a high extinction ratio.

Another exemplary use of scatterometers is for overlay (OV) metrology, which is useful for measuring alignment of a stack of layers on a wafer. In order to control the lithographic process to place device features accurately on the substrate, alignment marks, or targets, are generally provided on the substrate, and the lithographic apparatus includes one or more alignment apparatuses by which positions of marks on a substrate must be measured accurately. In one known technique, the scatterometer measures diffracted light from targets on the wafer.

Ideally, overlay error is solely a product of positioning of the substrate within the lithographic system. In practice, however, overlay error originates from the interaction between the alignment apparatus and the substrate. Variations in the alignment apparatus and substrate can produce errors in assessing the true location of the alignment marks. Such errors are known as "on-process" accuracy errors. Alignment apparatus optics contain manufacturing aberrations and, thus, cannot be made identical. Further, diffraction based alignment apparatus optics cannot differentiate between phase offsets induced by asymmetry variations in an alignment target and phase differences among diffraction orders of the alignment target. Substrates (e.g., wafer stacks), likewise, have properties variations stemming from manufacturing and post-manufacturing processes. Asymmetry variations in an alignment target from processing can cause alignment errors as large as several nanometers and are difficult to predict or calibrate. This "on-process" accuracy problem limits the robustness of the alignment apparatus.

Accordingly, there is a need to compensate for variations in an alignment apparatus and system, and process variations in the substrate.

SUMMARY

In some embodiments, an alignment sensor apparatus includes an illumination system, a first optical system, a second optical system, a detector system, one or more optical filters, and a processor. In some embodiments, the illumination system is configured to transmit an illumination beam along an illumination path. In some embodiments, the first optical system includes a first optic and a second optic. In some embodiments, the first optical system is configured to transmit the illumination beam toward a diffraction target on a substrate and transmit a signal beam comprising diffraction order sub-beams reflected from the diffraction target along a signal path. In some embodiments, the second optical system includes a first polarizing optic configured to separate and transmit the signal beam into a first polarization optical branch and a second polarization optical branch based on the polarization of the signal beam. In some embodiments, the detector system includes one or more detectors. In some embodiments, the detector system is configured to measure an alignment position of the diffraction target based on the signal beam outputted from the first polarization branch and the second polarization branch. In some embodiments, one or more optical filters are disposed along the illumination path and/or the signal path. In some embodiments, one or more optical filters are configured to adjust one or more physical parameters of the illumination beam and/or the signal beam. In some embodiments, the processor is coupled to the detector system. In some embodiments, the processor is configured to measure a change in the alignment position of the diffraction target caused by the one or more optical filters. In some embodiments, the processor is configured to determine a sensor response function of the alignment sensor apparatus based on the change.

In some embodiments, the first polarization optical branch includes a first polarizing filter, a first self-referencing interferometer, a second polarizing filter, and a second polarizing optic. In some embodiments, the second polarization optical branch includes a third polarizing filter, a second self-referencing interferometer, a fourth polarizing filter, and a third polarizing optic.

In some embodiments, the processor is further configured to correct an alignment position error of the sensor apparatus based on the sensor response function. In some embodiments, the processor corrects the alignment position error by calculating a derivative and/or a minimum value of the sensor response function for the one or more physical parameters.

In some embodiments, one or more optical filters is selected from the group consisting of a spectral filter, a numerical aperture filter, a neutral density filter, a patterned filter, and a polarizing filter. In some embodiments, the spectral filter is a narrow passband wavelength filter. In some embodiments, the numerical aperture filter is a lens configured to change an optical power of the illumination beam and/or the signal beam. In some embodiments, the patterned filter is a patterned reference reticle. In some embodiments, the polarizing filter is a waveplate.

In some embodiments, the alignment sensor apparatus further includes a third optical system including a third optic and a second detector system including one or more further detectors. In some embodiments, the third optical system is configured to measure an intensity of the signal beam and/or an asymmetry of the signal beam based on an asymmetry of the diffraction target.

In some embodiments, a lithographic apparatus includes a first illuminations optical system, a projection optical system, and an alignment sensor apparatus. In some embodiments, the first illumination optical system is configured to illuminate a diffraction pattern. In some embodiments, the projection optical system is configured to project an image of the diffraction pattern onto a substrate. In some embodiments, the alignment sensor apparatus is configured to correct an alignment position error of the lithographic apparatus.

In some embodiments, the alignment sensor apparatus includes a second illumination optical system, a first optical system, a second optical system, a detector system, one or more optical filters, and a processor. In some embodiments, the second illumination optical system is configured to transmit at least one illumination beam of radiation along an illumination path. In some embodiments, the first optical system includes a first optic and a second optic. In some embodiments, the first optical system is configured to transmit the illumination beam toward the diffraction pattern on the substrate and transmit a signal beam comprising diffraction order sub-beams reflected from the diffraction pattern along a signal path. In some embodiments, the second optical system includes a first polarizing optic configured to separate and transmit the signal beam into a first polarization optical branch and a second polarization optical branch based on the polarization of the signal beam. In some embodiments, the detector system includes one or more detectors. In some embodiments, the detector system is configured to measure an alignment position of the diffraction pattern based on the signal beam outputted from the first polarization branch and the second polarization branch. In some embodiments, one or more optical filters is disposed along the illumination path and/or the signal path. In some embodiments, one or more optical filters is configured to adjust one or more physical parameters of the illumination beam and/or the signal beam. In some embodiments, the processor is coupled to the detector system. In some embodiments, the processor is configured to measure a change in the alignment position of the diffraction pattern caused by the one or more optical filters. In some embodiments, the processor is configured to determine a sensor response function of the alignment sensor apparatus based on the change.

In some embodiments, the processor is further configured to correct an alignment position error of the lithographic apparatus based on the sensor response function. In some embodiments, the processor is further configured to correct the alignment position error by calculating a derivative and/or a minimum value of the sensor response function for the one or more physical parameters.

In some embodiments, the one or more optical filters is selected from the group consisting of a spectral filter, a numerical aperture filter, and a polarizing filter. In some embodiments, the spectral filter is a narrow passband wavelength filter. In some embodiments, the numerical aperture filter is a lens configured to change an optical power of the illumination beam and/or the signal beam. In some embodiments, the polarizing filter is a half-wave plate or quarter-wave plate. In some embodiments, the first optical system is configured to transmit the signal beam so as to include first and second first diffraction order sub-beams. In some embodiments, the detector system combines the first and second first diffraction order sub-beams to generate a sinusoidal phase.

In some embodiments, the one or more optical filters is a spectral filter. In some embodiments, the processor is configured to determine the sensor response function based on the change between different wavelengths of the illumination beam and/or the signal beam. In some embodiments, the one or more optical filters is a numerical aperture filter. In some embodiments, the processor is configured to determine the sensor response function based on the change between different diffraction order sub-beams of the signal beam. In some embodiments, the one or more optical filters is a polarizing filter. In some embodiments, the processor is configured to determine the sensor response function based on the change between different polarizations of the illumination beam and/or the signal beam.

In some embodiments, a method for correcting alignment position error includes measuring, by an alignment sensor apparatus, an alignment position of a diffraction target on a substrate. In some embodiments, the alignment sensor apparatus includes an illumination system, a first optical system, a second optical system, a detector system, and a processor. In some embodiments, the illumination system is configured to transmit an illumination beam along an illumination path. In some embodiments, the first optical system includes a first optic and a second optic, and is configured to transmit the illumination beam toward the diffraction target on the substrate and transmit a signal beam comprising diffraction order sub-beams reflected from the diffraction target along a signal path. In some embodiments, the second optical system includes a first polarizing optic configured to separate and transmit the signal beam into a first polarization optical branch and a second polarization optical branch based on the polarization of the signal beam. In some embodiments, the detector system includes one or more detectors. In some embodiments, the detector system is configured to measure the alignment position of the diffraction target based on the signal beam outputted from the first polarization branch and the second polarization branch. In some embodiments, the processor is coupled to the detector system.

In some embodiments, the method further includes adjusting one or more physical parameters of the illumination beam and/or signal beam using one or more optical filters along the illumination path and/or the signal path of the alignment sensor apparatus. In some embodiments, the method further includes measuring, by the processor, a change in the alignment position of the diffraction target. In some embodiments, the method further includes determining, by the processor, a sensor response function of the alignment sensor apparatus. In some embodiments, the method further includes correcting, by calculating a derivative and/or minimum value of the sensor response function for the one or more physical parameters, an alignment position error of a lithographic apparatus or the alignment sensor apparatus based on the sensor response function.

In some embodiments, adjusting the one or more physical parameters includes using a spectral filter. In some embodiments, determining the sensor response function includes measuring the change between different wavelengths of the illumination beam and/or the signal beam. In some embodiments, adjusting the one or more physical parameters includes using a numerical aperture filter. In some embodiments, determining the sensor response function includes measuring the change between different diffraction order sub-beams of the signal beam. In some embodiments, adjusting the one or more physical parameters comprises using a polarizing filter. In some embodiments, determining the sensor response function includes measuring the change between different polarizations of the illumination beam and/or the signal beam.

In some embodiments, an alignment sensor apparatus includes an illumination system, a first optical system, a second optical system, a detector system, and a processor. In some embodiments, the illumination system is configured to transmit an illumination beam along an illumination path. In some embodiments, the first optical system includes a first optic and a second optic. In some embodiments, the first optical system is configured to transmit the illumination beam toward a diffraction target on a substrate and transmit an irradiance distribution including diffraction order sub-beams reflected from the diffraction target along a signal path. In some embodiments, the second optical system includes a first polarizing optic configured to separate and transmit the irradiance distribution into a first polarization optical branch and a second polarization optical branch based on the polarization of the irradiance distribution. In some embodiments, the detector system includes one or more detectors. In some embodiments, the detector system is configured to measure a center of gravity of the diffraction target based on the irradiance distribution outputted from the first polarization branch and the second polarization branch. In some embodiments, the processor is coupled to the detector system. In some embodiments, the processor is configured to measure a shift in the center of gravity of the diffraction target caused by an asymmetry variation in the diffraction target. In some embodiments, the processor is configured to determine a sensor response function of the alignment sensor apparatus based on the center of gravity shift.

In some embodiments, the asymmetry variation in the diffraction target includes an asymmetric side wall. In some embodiments, the asymmetric side wall includes an angled side wall having an angle of about 0 degrees to about 10 degrees. In some embodiments, the asymmetry variation in the diffraction target includes an asymmetric bottom surface. In some embodiments, the asymmetric bottom surface includes an angled bottom surface having an angle of about 0 degrees to about 5 degrees. In some embodiments, the asymmetry variation in the diffraction target includes an asymmetric top surface. In some embodiments, the asymmetric top surface includes an angled top surface having an angle of about 0 degrees to about 5 degrees.

In some embodiments, the processor is further configured to correct an alignment position error of the sensor apparatus based on the sensor response function. In some embodiments, the processor corrects the alignment position error by calculating a first center of gravity shift and a second center of gravity shift. In some embodiments, the first and second center of gravity shifts are calculated as a function of one or more wavelengths of the illumination beam.

In some embodiments, a pupil sensor apparatus includes an illumination system, a first optical system, a second optical system, and a detector system. In some embodiments, the illumination system is configured to transmit an illumination beam along an illumination path. In some embodiments, the first optical system includes a first optic and a second optic. In some embodiments, the first optical system is configured to transmit the illumination beam toward a diffraction target on a substrate and transmit an irradiance distribution including diffraction order sub-beams reflected from the diffraction target along a signal path. In some embodiments, the second optical system includes a first polarizing optic configured to separate and transmit the irradiance distribution into a first polarization optical branch and a second polarization optical branch based on the polarization of the irradiance distribution. In some embodiments, the detector system includes one or more detectors. In some embodiments, the detector system is configured to measure a pupil plane depth distribution of the diffraction target based on the irradiance distribution outputted from the first polarization branch and the second polarization branch and a reference irradiance distribution.

In some embodiments, the pupil sensor apparatus further includes a processor coupled to the detector system. In some embodiments, the processor is configured to measure a shift in the pupil plane depth distribution caused by an asymmetry variation in the diffraction target or a stack thickness variation. In some embodiments, the processor is configured to determine a sensor response function of the pupil sensor apparatus based on the pupil plane depth distribution shift. In some embodiments, the processor is further configured to correct an alignment position error of the pupil sensor apparatus based on the sensor response function. In some embodiments, the processor corrects the alignment position error by calculating a first center of gravity shift and a second center of gravity shift.

In some embodiments, the reference irradiance distribution is based on an aberration map of the detector system. In some embodiments, the detector system includes a pupil detector external to the first and second optical systems and configured to measure the pupil plane depth distribution. In some embodiments, the pupil detector includes a focusing optic and a light source. In some embodiments, the focusing optic is the same as the second optic, and the light source is the same as the illumination beam. In some embodiments, the focusing optic is different from the second optic, and the light source is the same as the illumination beam. In some embodiments, the focusing optic is different from the second optic, and the light source is different from the illumination beam.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
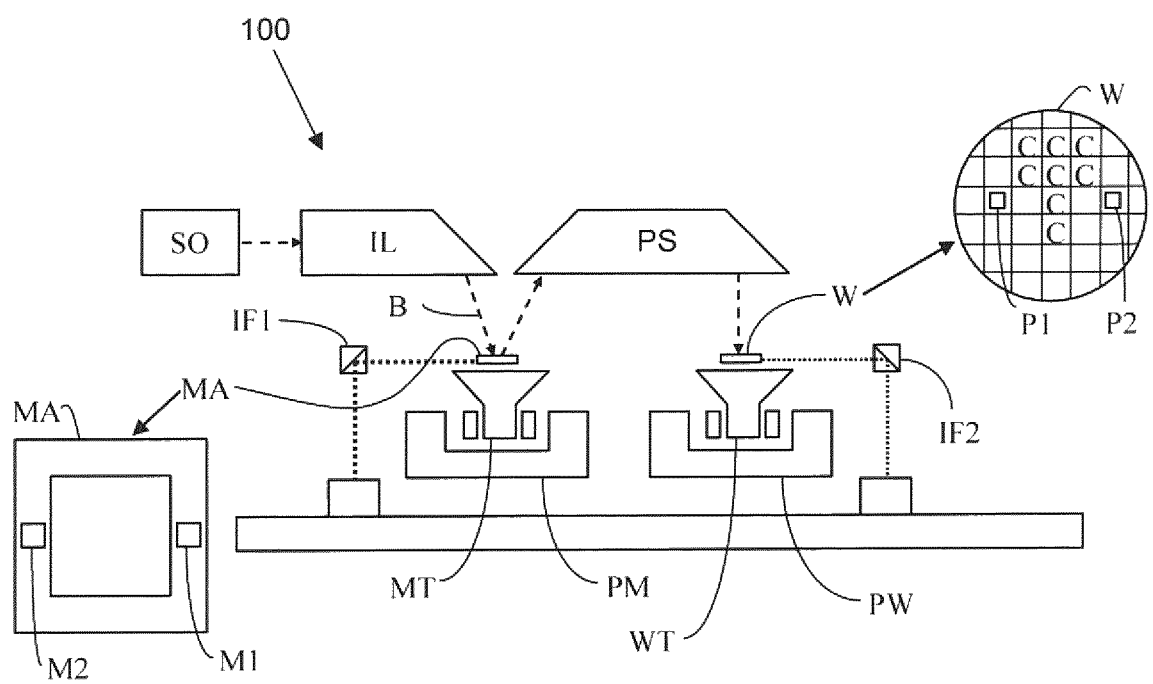
FIG. 1A is a schematic illustration of a reflective lithographic apparatus, according to an exemplary embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Example Lithographic Systems

Figure 1B:
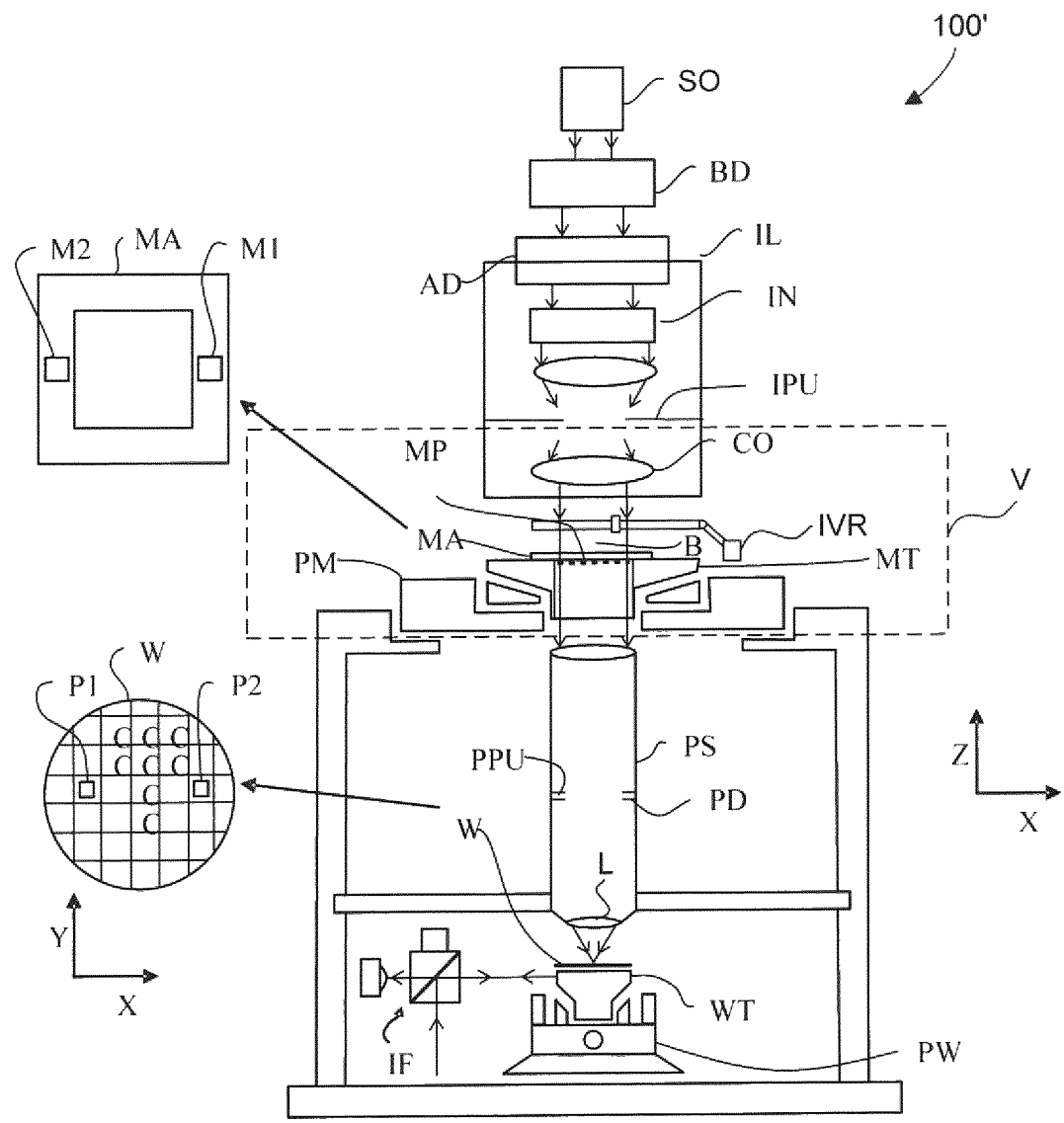
FIG. 1B is a schematic illustration of a transmissive lithographic apparatus, according to an exemplary embodiment.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-) magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
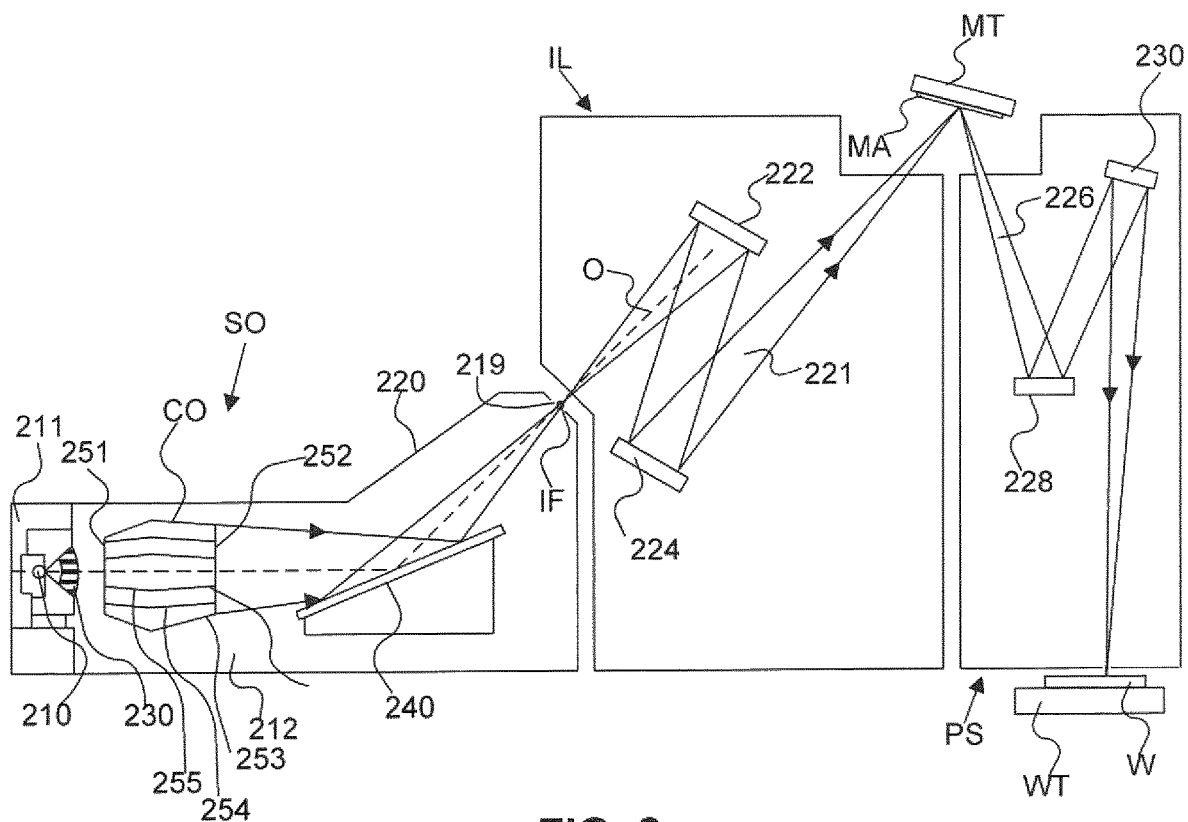
FIG. 2 is a more detailed schematic illustration of the reflective lithographic apparatus, according to an exemplary embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
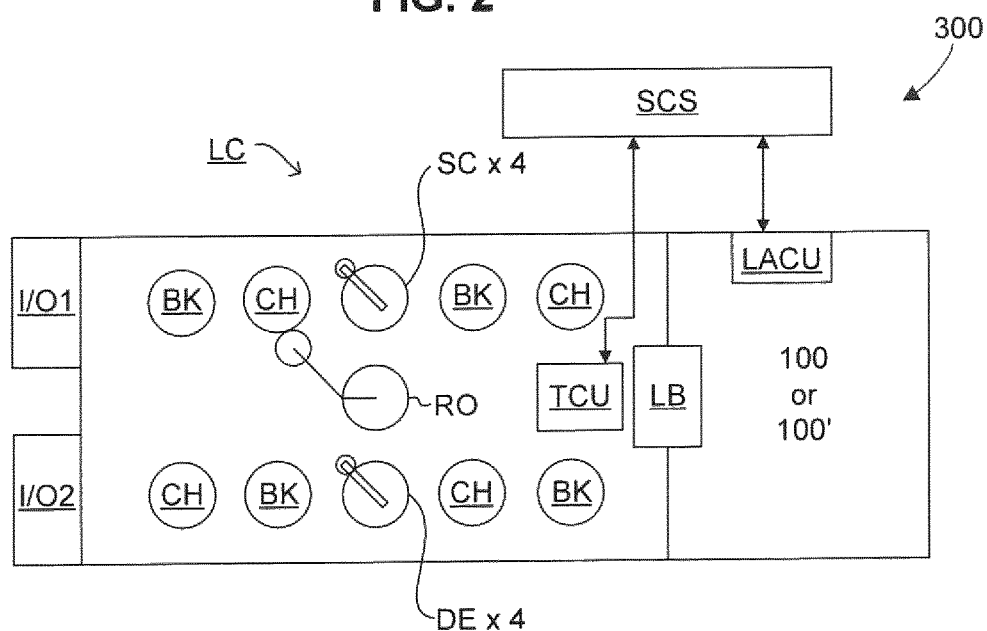
FIG. 3 is a schematic illustration of a lithographic cell, according to an exemplary embodiment.

FIG. 3 shows a lithographic cell 300, also sometimes referred to a lithocell or cluster. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Alignment Apparatus

In order to control the lithographic process to place device features accurately on the substrate, alignment marks are generally provided on the substrate, and the lithographic apparatus includes one or more alignment apparatuses and/ or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.). Generally marks are measured separately to obtain X- and Y-positions. A combined X- and Y-measurement can be performed using the techniques described in U.S. Publication No. 2009/195768 A (Bijnen et al.), however. The full contents of both of these disclosures are incorporated herein by reference.

Figure 4A:
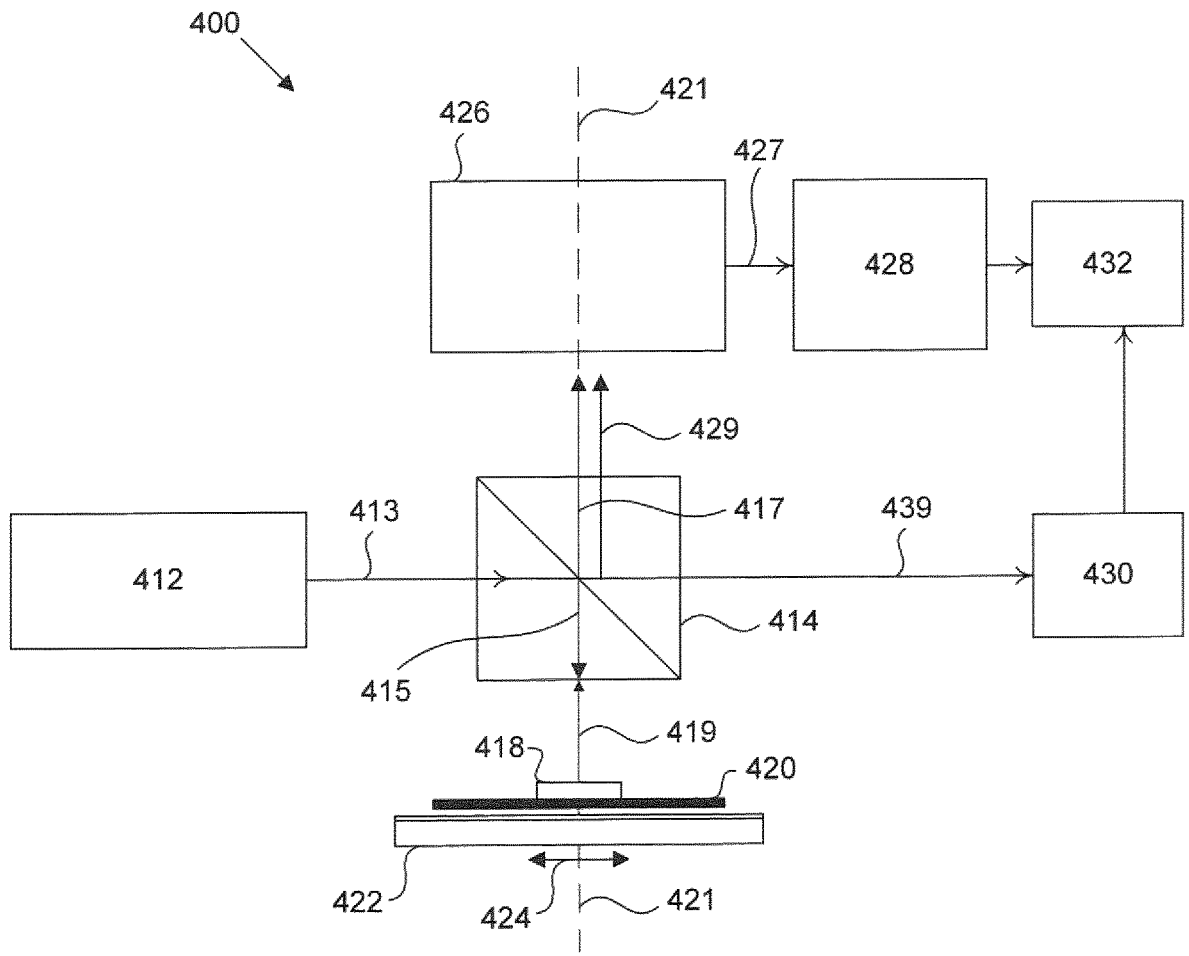
FIGS. 4A and 4B are schematic illustrations of enhanced alignment apparatuses, according to various exemplary embodiments.

FIG. 4A illustrates a schematic of a cross-sectional view of an alignment apparatus 400 that can be implemented as a part of lithographic apparatus 100 or 100', according to an embodiment. In an example of this embodiment, alignment apparatus 400 may be configured to align a substrate (e.g., substrate W) with respect to a patterning device (e.g., patterning device MA). Alignment apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate.

According to an embodiment, alignment apparatus 400 may include an illumination system 412, a beam splitter 414, an interferometer 426, a detector 428, a beam analyzer 430, and an overlay calculation processor 432, according to an example of this embodiment. Illumination system 412 may be configured to provide an electromagnetic narrow band radiation beam 413 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. Illumination system 412 may be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current alignment systems. And, as a result, the use of constant CWL values may improve long-term stability and accuracy of alignment systems (e.g., alignment apparatus 400) compared to the current alignment apparatuses.

Beam splitter 414 may be configured to receive radiation beam 413 and split radiation beam 413 into at least two radiation sub-beams, according an embodiment. In an example, radiation beam 413 may be split into radiation sub-beams 415 and 417, as shown in FIG. 4A. Beam splitter 414 may be further configured to direct radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film in an example of this embodiment. In another example, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be (a) a resist layer grating comprising bars that are formed of solid resist lines, or (b) a product layer grating, or (c) a composite grating stack in an overlay target structure comprising a resist grating overlaid or interleaved on a product layer grating. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Beam splitter 414 may be further configured to receive diffraction radiation beam 419 and split diffraction radiation beam 419 into at least two radiation sub-beams, according to an embodiment. In an example, diffraction radiation beam 419 may be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements may be used to obtain the similar result of illuminating alignment mark or target 418 on substrate 420 and detecting an image of alignment mark or target 418.

As illustrated in FIG. 4A, interferometer 426 may be configured to receive radiation sub-beam 417 and diffracted radiation sub-beam 429 through beam splitter 414. In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. It should be appreciated that a good quality image need not be formed, but that the features of alignment mark 418 should be resolved. Interferometer 426 may be further configured to rotate one of the two images with respect to the other of the two images 180° and recombine the rotated and unrotated images interferometrically.

In an embodiment, detector 428 may be configured to receive the recombined image via interferometer signal 427 and detect interference as a result of the recombined image when alignment axis 421 of alignment apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations). This data can for example be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or ATHENA (Advanced Technology using High order ENhancement of Alignment), as described in U.S. Pat. No. 6,297,876, which directs each of seven diffraction orders to a dedicated detector, which are both incorporated by reference herein in their entireties.

In an embodiment, beam analyzer 430 may be configured to receive and determine an optical state of diffracted radiation sub-beam 439. The optical state may be a measure of beam wavelength, polarization, or beam profile. Beam analyzer 430 may be further configured to determine a position of stage 422 and correlate the position of stage 422 with the position of the center of symmetry of alignment mark or target 418. As such, the position of alignment mark or target 418 and, consequently, the position of substrate 420 may be accurately known with reference to stage 422. Alternatively, beam analyzer 430 may be configured to determine a position of alignment apparatus 400 or any other reference element such that the center of symmetry of alignment mark or target 418 may be known with reference to alignment apparatus 400 or any other reference element. Beam analyzer 430 can be a point or an imaging polarimeter with some form of wavelength-band selectivity. According to an embodiment, beam analyzer 430 may be directly integrated into alignment apparatus 400, or connected via fiber optics of several types: polarization preserving single mode, multimode, or imaging, according to other embodiments.

In an embodiment, beam analyzer 430 may be further configured to determine the overlay data between two patterns on substrate 420. One of these patterns may be a reference pattern on a reference layer. The other pattern may be an exposed pattern on an exposed layer. The reference layer may be an etched layer already present on substrate 420. The reference layer may be generated by a reference pattern exposed on the substrate by lithographic apparatus 100 and/or 100'. The exposed layer may be a resist layer exposed adjacent to the reference layer. The exposed layer may be generated by an exposure pattern exposed on substrate 420 by lithographic apparatus 100 or 100'. The exposed pattern on substrate 420 may correspond to a movement of substrate 420 by stage 422. In an embodiment, the measured overlay data may also indicate an offset between the reference pattern and the exposure pattern. The measured overlay data may be used as calibration data to calibrate the exposure pattern exposed by lithographic apparatus 100 or 100', such that after the calibration, the offset between the exposed layer and the reference layer may be minimized.

In an embodiment, beam analyzer 430 may be further configured to determine a model of the product stack profile of substrate 420, and may be configured to measure overlay, critical dimension, and focus of target 418 in a single measurement. The product stack profile contains information on the stacked product such as alignment mark, target 418, or substrate 420, and may include mark process variation-induced optical signature metrology that is a function of illumination variation. The product stack profile may also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 may be further configured to process information related to a particular property of an exposed pattern in that layer. For example, beam analyzer 430 may process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) may be connected to beam analyzer 430, and allows the possibility of accurate stack profile detection as discussed below. For example, detector 428 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Figure 4B:
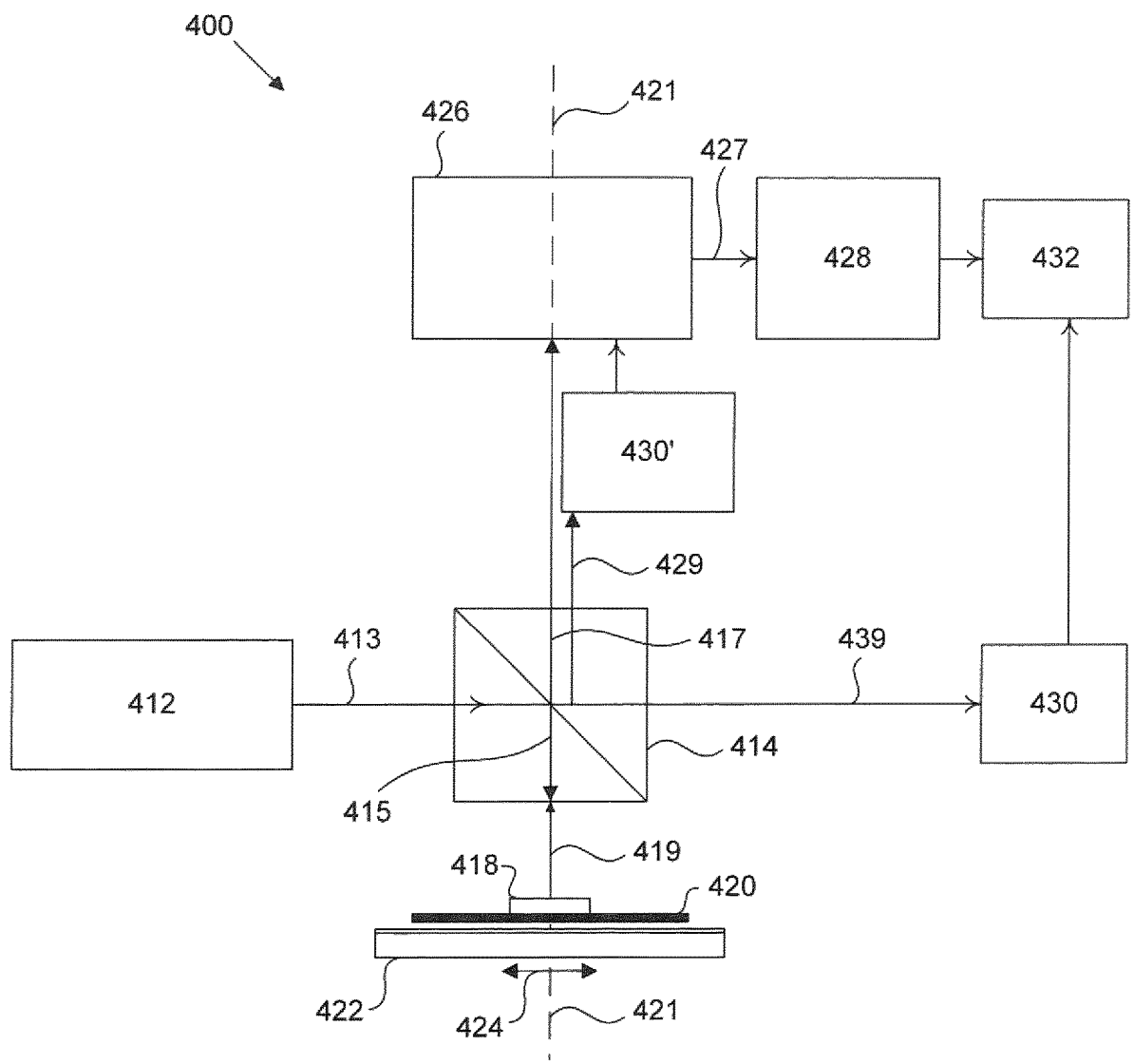

In an embodiment, a second beam analyzer 430' may be configured to receive and determine an optical state of diffracted radiation sub-beam 429, as shown in FIG. 4B. The optical state may be a measure of beam wavelength, polarization, or beam profile. Second beam analyzer 430' may be identical to beam analyzer 430. Alternatively, second beam analyzer 430' may be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, may be accurately known with reference to stage 422. Second beam analyzer 430' may also be configured to determine a position of alignment apparatus 400, or any other reference element, such that the center of symmetry of alignment mark or target 418 may be known with reference to alignment apparatus 400, or any other reference element. Second beam analyzer 430' may be further configured to determine the overlay data between two patterns and a model of the product stack profile of substrate 420. Second beam analyzer 430' may also be configured to measure overlay, critical dimension, and focus of target 418 in a single measurement.

In an embodiment, second beam analyzer 430' may be directly integrated into alignment apparatus 400, or it can be connected via fiber optics of several types: polarization preserving single mode, multimode, or imaging, according to other embodiments. Alternatively, second beam analyzer 430' and beam analyzer 430 may be combined to form a single analyzer (not shown) configured to receive and determine the optical states of both diffracted radiation sub-beams 429 and 439.

In an embodiment, processor 432 receives information from detector 428 and beam analyzer 430. For example, processor 432 may be an overlay calculation processor. The information may comprise a model of the product stack profile constructed by beam analyzer 430. Alternatively, processor 432 may construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 may create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 may utilize the basic correction algorithm to characterize the alignment apparatus 400 with reference to wafer marks and/or alignment marks 418.

In an embodiment, processor 432 may be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 may utilize a clustering algorithm to group the marks into sets of similar constant offset error, and create an alignment error offset correction table based on the information. The clustering algorithm may be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error can be deduced. Table 1 illustrates how this may be performed. The smallest measured overlay in the example shown is −1 nm. However this is in relation to a target with a programmed overlay of −30 nm. Consequently the process must have introduced an overlay error of 29 nm.

TABLE 1

| | | | | | | | |
|---|---|---|---|---|---|---|---|
| Programmed overlay | −70 | −50 | −30 | −10 | 10 | 30 | 50 |
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value can be taken to be the reference point and, relative to this, the offset can be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 can also be obtained from marks and target 418 under different illumination settings, the illumination setting, which results in the smallest overlay error, and its corresponding calibration factor, may be determined and selected. Following this, processor 432 may group marks into sets of similar overlay error. The criteria for grouping marks may be adjusted based on different process controls, for example, different error tolerances for different processes.

In an embodiment, processor 432 may confirm that all or most members of the group have similar offset errors, and apply an individual offset correction from the clustering algorithm to each mark, based on its additional optical stack metrology. Processor 432 may determine corrections for each mark and feed the corrections back to lithographic apparatus 100 or 100' for correcting errors in the overlay, for example, by feeding corrections into the alignment apparatus 400.

Exemplary Alignment Sensor Apparatus

As discussed above, on-process accuracy errors (OPAEs) are caused by varying stack thicknesses, materials, and/or processes on each wafer (i.e., process variations) and overlay errors due to the interaction between alignment sensors. Process variations change the optical properties of reflected light from an alignment mark on a substrate, which causes OPAEs. Despite various techniques, such as mark asymmetry reconstruction (MAR), which corrects for asymmetries in an alignment mark, improved sensors (e.g., SMASH), and predictive modeling, wafer stack properties variations (i.e., process variations) cause a lower limit for OPAEs and cannot be reduced further using current techniques and systems. Process variations interact with an alignment sensor and create an alignment position error (APE) that cannot be calibrated.

APE is a change or shift in alignment position from a reference alignment position (e.g., calibrated alignment mark on a substrate). However, APE is a function of various physical parameters, for example, beam wavelength, spectral bandwidth, numerical aperture, beam intensity, beam spot size, beam shape, beam pattern, and/or polarization. For example, APE may be modeled as a linear function for one or more physical parameters. When physical parameters are varied in an alignment and/or lithographic apparatus, a change or shift in the reference alignment position due to unknown process variations can be measured and a correction can be determined and applied in order to reduce OPAEs.

Figure 5:
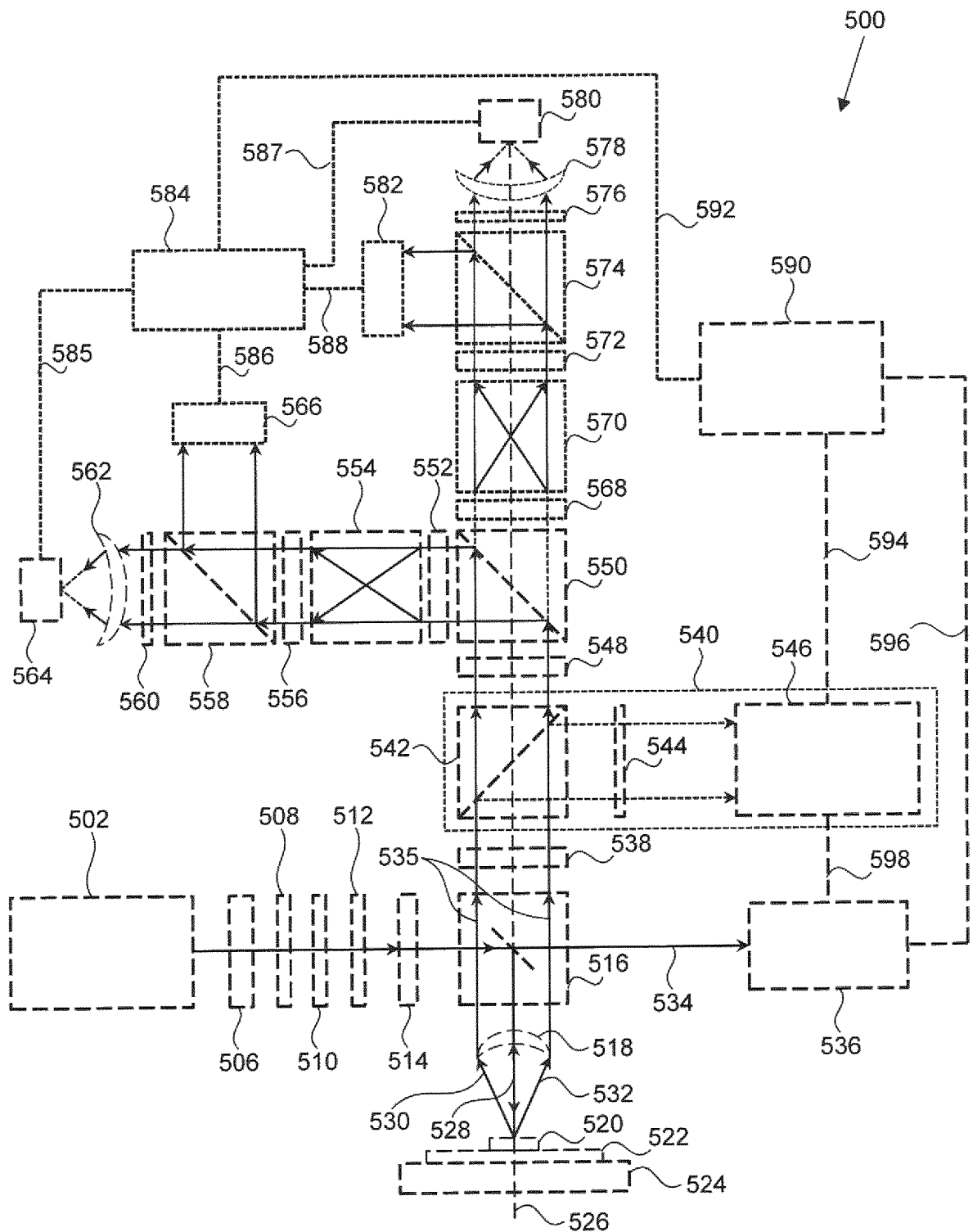
FIG. 5 is a schematic illustration of an alignment sensor apparatus, according to an exemplary embodiment.

FIG. 5 illustrates alignment sensor apparatus 500, according to an exemplary embodiment. Alignment sensor apparatus 500 is configured to correct APE and improve overlay, for example, in lithographic apparatus 100 or 100'. Alignment sensor apparatus 500 may include illumination system 502, spot mirror 516, focusing lens 518, polarizing beam splitter 550, detector controller 584, one or more optical filters 506, 508, 510, 512, 514, 538, 548, 560, 576, and APE processor 590. Although alignment sensor apparatus 500 is shown in FIG. 5 as a stand-alone apparatus, the embodiments of this disclosure are not limited to this example, and alignment sensor apparatus 500 embodiments of this disclosure can be used with other optical systems, such as, but not limited to, lithographic apparatus 100 and/or 100', lithocell 300, alignment apparatus 400, and/or other optical systems.

Illumination system 502 is configured to transmit illumination beam 504 along an illumination path toward spot mirror 516. Illumination system 502 is similar to illumination system 412 described in FIGS. 4A and 4B. For example, illumination system 502 can include an extreme ultraviolet (EUV) source, which is configured to generate a beam of EUV radiation. Illumination system 502 may include a EUV source in a radiation system and a corresponding conditioning system configured to condition the EUV radiation beam of the EUV source.

Illumination system 502 may be configured to provide an electromagnetic narrow band illumination beam 504 having one or more passbands. In an example, the one or more passbands may be within a spectrum of wavelengths between about 500 nm to about 900 nm. In an example, the one or more passbands may be within a spectrum of wavelengths between about 10 nm to about 500 nm. In another example, the one or more passbands may be discrete narrow passbands within a spectrum of wavelengths between about 500 nm to about 900 nm. In another example, the one or more passbands may be discrete narrow passbands within a spectrum of wavelengths between about 10 nm to about 500 nm. Illumination system 502 may be further configured to provide one or more passbands having substantially constant center wavelength (CWL) values over a long period of time (e.g., over a lifetime of illumination system 502). Such configuration of illumination system 502 may help to prevent the shift of the actual CWL values from the desired CWL values, as discussed above, in current alignment systems. And, as a result, the use of constant CWL values may improve long-term stability and accuracy of alignment systems (e.g., alignment sensor apparatus 500) compared to the current alignment apparatuses.

In some embodiments, illumination system 502 may use a broadband light source (i.e., one with a wide range of light frequencies or wavelengths—and, thus, of colors) for a radiation source that may give a large etendue (i.e., spread of light, e.g., the product of the area (A) of the source and the solid angle (Ω) that the system's entrance pupil subtends as seen from the source), allowing the mixing of multiple wavelengths. In some embodiments, illumination beam 504 may include a plurality of wavelengths in the broadband preferably may each have a bandwidth of $\Delta\lambda$ and a spacing of at least $2\Delta\lambda$ (i.e., twice the bandwidth). In some embodiments, illumination system 502 may include several "sources" of radiation for different portions of an extended radiation source that have been split using fiber bundles. In this way, angle resolved scatter spectra can be measured at multiple wavelengths in parallel. For example, a 3-D spectrum (wavelength and two different angles) can be measured, which contains more information than a 2-D spectrum. This allows more information to be measured, which increases metrology process robustness. This is described in more detail in EP 1628164 A2, which is incorporated by reference herein in its entirety.

Spot mirror 516 is a transmissive cube with a reflective metal layer disposed in the center of the cube. As shown in FIG. 5, spot mirror 516 may form a 45° angle with the illumination path in order to direct illumination beam 504 toward substrate 522. In an embodiment, spot mirror 516 may be a beam splitter configured to reflect a first portion (e.g., 50%) of illumination beam 504 toward substrate 522 and transmit a second portion (e.g., 50%) of illumination beam 504 toward beam analyzer 536. Beam analyzer 536 is similar to beam analyzer 430 described in FIGS. 4A and 4B, and is configured to analyze various properties of illumination beam 504, for example, intensity, beam shape, alignment position, and/or polarization.

As shown in FIG. 5, spot mirror 516 may transmit illumination beam 504 toward focusing lens 518, which focuses illumination beam 504 on diffraction target 520 on substrate 522. In an embodiment, diffraction target 520 may be an alignment mark. In an embodiment, substrate 522 is supported by stage 524 and centered along alignment axis 526. In some embodiments, diffraction target 520 on substrate 522 may be a 1-D grating, which is printed such that after development, bars are formed of solid resist lines. In some embodiments, diffraction target 520 may be a 2-D array or grating, which is printed such that, after development, a grating is formed of solid resist pillars or vias in the resist. For example, bars, pillars, or vias may alternatively be etched into substrate 522.

Focused illumination beam 504 on diffraction target 520 creates a signal beam along signal path 535 comprising diffraction order sub-beams 528, 530, 532 reflected from diffraction target 520. As shown in FIG. 5, first diffraction order sub-beam 528, second diffraction order sub-beam 530, and third diffraction order sub-beam 532 reflect off diffraction target 520 back toward focusing lens 518 and create signal path 535. In some embodiments, focusing lens 518 may be positioned at the pupil plane. The pupil plane is the plane in which the radial position of radiation defines the angle of incidence and the angular position defines the azimuth angle of the radiation.

In some embodiments, first diffraction order sub-beam 528 may be a zeroth diffraction order sub-beam, second diffraction order sub-beam 530 may be a first diffraction order sub-beam (e.g., −1), and third diffraction order sub-beam 532 may be a first diffraction order sub-beam (e.g., +1). As shown in FIG. 5, spot mirror 516 blocks and/or reflects first diffraction order sub-beam 528 and transmits second and third diffraction order sub-beams 530, 532 along signal path 535. In some embodiments, spot mirror 516 reflects first diffraction order sub-beam 528 toward beam analyzer 536, which is configured to analyze various properties of first diffraction order sub-beam 528, for example, intensity, beam shape, alignment position, and/or polarization.

Second and third diffraction order sub-beams 530, 532 transmit along signal path 535 to polarizing beam splitter 550 configured to separate and transmit second and third diffraction order sub-beams 530, 532 into a first polarization optical branch (e.g. "X" direction, s-polarized) and a second polarization optical branch (e.g., "Y" direction, p-polarized) based on the polarization of sub-beams 530, 532. Polarized radiation with its electric field along the plane of incidence is deemed p-polarized (i.e., transverse-magnetic (TM)), while polarized radiation with its electric field normal to the plane of incidence is deemed s-polarized (i.e., transverse-electric (TE)). Polarizing beam splitter 550 splits signal path 535 into orthogonal polarization components (i.e., first and second polarization optical branches), and transmits s-polarized sub-beams 530, 532 into first polarization optical branch ("X" direction, s-polarized) and transmits p-polarized sub-beams 530, 532 into second polarization optical branch ("Y" direction, p-polarized).

First polarization optical branch is configured to transmit s-polarized sub-beams 530, 532 and measure any change, shift, and/or deviation in an alignment position of diffraction target 520 in a horizontal or "X" direction, with reference to alignment axis 526. As shown in FIG. 5, first polarization optical branch may include first polarizing filter 552, "X" direction self-referencing interferometer (SRI-X) 554, second polarizing filter 556, and polarizing beam splitter 558. S-polarized sub-beams 530, 532 transmit through first polarizing filter 552, SRI-X 554, and second polarizing filter 556 in order. In some embodiments, first and second polarizing filters 552, 556 may each be a waveplate, for example, a half-wave plate at 22.5° ($\pi/8$). In some embodiments, first and second polarizing filters 552, 556 may each be a waveplate, for example, a quarter-wave plate at 45° ($\pi/4$).

A half-wave plate induces a phase shift of 180° ($\pi$) and rotates a polarization angle $\theta$, formed between the polarization vector and the fast axis vector, to $-\theta$. For linearly polarized light, a half-wave plate rotates $\theta$ to $2\theta$, while for elliptically (e.g., circularly) polarized light, a half-wave plate inverts the chirality (e.g., from right-circular to left-circular). A quarter-wave plate induces a phase shift of 90° ($\pi/2$) and the output depends upon an input polarization angle $\varphi$, formed between the fast and slow axis vectors. For linearly polarized light, $\varphi=0°$ produces no change in the linear polarization, $\varphi=45°$ produces circular polarization, and $0°<\varphi<45°$ produces elliptical polarization.

First polarizing filter 552, SRI-X 554, and second polarizing filter 556 are configured to rotate an image of s-polarized sub-beams 530, 532 by 180° and recombine the two images, which are 180° out of phase with the other. The two recombined images are transmitted to polarizing beam splitter 558. Polarizing beam splitter 558 is configured to separate and transmit the difference between the two recombined images into first position detector 566 and the sum of the two recombined images into second position detector 564. As shown in FIG. 5, focusing lens 562 may be included in first polarization optical branch in order to focus the sum of the two recombined images onto second position detector 564. In some embodiments, an additional focusing lens, similar to focusing lens 562, may be included between first position detector 566 and polarizing beam splitter 558 in order to focus the difference of the two recombined images.

Second polarization optical branch is similar to first polarization optical branch, and is configured to transmit p-polarized sub-beams 530, 532 and measure any change, shift, and/or deviation in an alignment position of diffraction target 520 in a vertical or "Y" direction, with reference to alignment axis 526. As shown in FIG. 5, first polarization optical branch may include first polarizing filter 568, "Y" direction self-referencing interferometer (SRI-Y) 570, second polarizing filter 572, and polarizing beam splitter 574. P-polarized sub-beams 530, 532 transmit through first polarizing filter 568, SRI-Y 570, and second polarizing filter 572 in order. In some embodiments, first and second polarizing filters 568, 572 may each be a waveplate, for example, a half-wave plate at 22.5° ($\pi/8$). In some embodiments, first and second polarizing filters 568, 572 may each be a waveplate, for example, a quarter-wave plate at 45° ($\pi/4$).

First polarizing filter 568, SRI-Y 570, and second polarizing filter 572 are configured to rotate an image of p-polarized sub-beams 530, 532 by 180° and recombine the two images, which are 180° out of phase with the other. The two recombined images are transmitted to polarizing beam splitter 574. Polarizing beam splitter 574 is configured to separate and transmit the difference between the two recombined images into third position detector 582 and the sum of the two recombined images into fourth position detector 580. As shown in FIG. 5, focusing lens 578 may be included in second polarization optical branch in order to focus the sum of the two recombined images onto fourth position detector 580. In some embodiments, an additional focusing lens, similar to focusing lens 578, may be included between third position detector 582 and polarizing beam splitter 574 in order to focus the difference of the two recombined images.

As shown in FIG. 5, detector controller 584 may be connected to first position detector 566, second position detector 564, third position detector 582, and fourth position detector 580 via first, second, third, and fourth control signals 586, 585, 588, 587, respectively. Detector controller 584 is configured to measure and detect an alignment position of diffraction target 520, with reference to alignment axis 526, based on the signal beams (e.g., difference and sum) outputted from the first and second polarization branches. In some embodiments, detector controller 584 is configured to measure any change, shift, and/or deviation in an alignment position of diffraction target 520 in a horizontal or "X" direction and/or in a vertical or "Y" direction. In some embodiments, detector controller 584 may combine second and third diffraction order sub-beams 530, 532 to generate a sinusoidal phase.

One or more optical filters may be disposed along an illumination path of illumination beam 504 and/or signal path 535 of second and third diffraction order sub-beams 530, 532. As discussed above, when an optical filter is disposed along the illumination path and/or signal path 535, one or more physical parameters of illumination beam 504 and/or sub-beams 530, 532 along signal path 535 is adjusted, and a change or shift in alignment position of diffraction target 520 from a reference alignment position occurs (e.g., calibrated diffraction target 520 on substrate 522).

As shown in FIG. 5, one or more optical filters may include spectral filter 506, numerical aperture (NA) filter 508, neutral density (ND) filter 510, patterned filter 512, and/or polarizing filter 514 disposed along an illumination path of illumination beam 504 and/or signal path 535. In some embodiments, spectral filter 506 may include a bandpass filter, a bandpass interference filter, a notch filter, a shortpass filter, a longpass filter, a step filter, and/or a dichroic filter. In some embodiments, NA filter 508 may include a lens, an objective, and/or a prism configured to change an optical power and/or beam shape of illumination beam 504 and/or sub-beams 530, 532 along signal path 535. In some embodiments, ND filter 510 may be configured to change an intensity and/or spot size of illumination beam 504 and/or sub-beams 530, 532 along signal path 535. In some embodiments, patterned filter 512 may include a patterned reticle and/or reference pattern disposed in illumination beam 504 and/or sub-beams 530, 532 along signal path 535. In some embodiments, polarizing filter 514 may include a waveplate disposed in illumination beam 504 and/or sub-beams 530, 532 along signal path 535. For example, polarizing filter 514 may be a half-wave plate or a quarter-wave plate.

In some embodiments, as shown in FIG. 5, one or more optical filters 506, 508, 510, 512, 514 may be disposed in illumination beam 504 and/or sub-beams 530, 532 along signal path 535 at various positions, including but not limited to optical filter 538, optical filter 544, optical filter 548, optical filter 560, and/or optical filter 576. For example, optical filter 538 may be a waveplate. For example, optical filter 560 may be a patterned reticle and/or reference pattern. For example, optical filter 544 may be a patterned reticle and/or reference pattern.

APE processor 590 is coupled to detector controller 584 via control signal 592. APE processor 590 is configured to measure a change and/or shift in an alignment position of diffraction target 520 caused by one or more optical filters 506, 508, 510, 512, 514, 538, 544, 548, 560, 576. APE processor 590 receives measured alignment position values from detector controller 584 to calculate a reference (i.e., calibrated) alignment position for diffraction target 520. When one or more optical filters 506, 508, 510, 512, 514, 538, 544, 548, 560, 576 is disposed in illumination beam 504 and/or sub-beams 530, 532 along signal path 535, APE processor 590 receives a subsequent (i.e., modified) alignment position for diffraction target 520 and calculates any change between the two measured alignment positions. Based on the change, APE processor 590 determines a sensor response function of alignment sensor apparatus 500. APE processor 590 is configured to correct an APE of alignment sensor apparatus 500 based on the sensor response function. In some embodiments, APE processor 590 is configured to correct an APE by calculating a derivative and/or a minimum value of the sensor response function for one or more physical parameters. In some embodiments, the sensor response function is calculated by APE processor 590 based on a linear model. In some embodiments, the sensor response function is calculated by APE processor 590 based on a non-linear model.

In an embodiment, after detector controller 584 and/or APE processor 590 determines a reference (i.e., calibrated) alignment position for diffraction target 520, spectral filter 506 is disposed in illumination beam 504 and/or sub-beams 530, 532 along signal path 535 to adjust one or more physical parameters. APE processor 590 is configured to determine the sensor response function based on the change between different wavelengths of illumination beam 504 and/or sub-beams 530, 532 along signal path 535. For example, illumination beam 504 may have an initial wavelength ($\lambda$) of 700 nm. A first alignment position (e.g., reference alignment position) of diffraction target 520 is measured at $\lambda_0$=700 nm to be $x_0$=0 nm. Spectral filter 506, for example, a notch filter, adjusts the wavelength of illumination beam 504 from 700 nm to 710 nm, and a second alignment position of diffraction target 520 is measured at $\lambda_1$=710 nm to be $x_1$=4 nm. Assuming APE is a linear function of wavelength, a sensor response function based on the change between different wavelengths is calculated by APE processor 590, such that the sensor response function is $\Delta x/\Delta\lambda$=(4 nm−0 nm)/(710 nm−700 nm)=0.4 or APE=(0.4)·$\Delta\lambda$.

In an embodiment, after detector controller 584 and/or APE processor 590 determines a reference (i.e., calibrated) alignment position for diffraction target 520, NA filter 508 is disposed in illumination beam 504 and/or sub-beams 532 along signal path 535 to adjust one or more physical parameters. APE processor 590 is configured to determine the sensor response function based on the change between one or more different diffraction order sub-beams 528, 530, 532 along signal path 535. For example, illumination beam 504 may have an initial NA of 1.35. A first alignment position (e.g., reference alignment position) of, for example, third diffraction order sub-beam 532 is measured at $NA_0$=1.35 to be $x_0$=0 nm. NA filter 508 adjusts the NA of illumination beam 504 from 1.35 to 1.20, and a second alignment position of third diffraction order sub-beam 532 is measured at $NA_1$=1.20 to be $x_1$=3 nm. Assuming APE is a linear function of diffraction order sub-beams, a sensor response function based on the change between different diffraction order-sub-beams is calculated by APE processor 590, such that the sensor response function is $\Delta x/\Delta NA$=(3 nm−0 nm)/(1.35−1.20)=20 or APE=(20)·$\Delta NA$ (nm).

In an embodiment, after detector controller 584 and/or APE processor 590 determines a reference (i.e., calibrated) alignment position for diffraction target 520, polarizing filter 514 is disposed in illumination beam 504 and/or sub-beams 530, 532 along signal path 535 to adjust one or more physical parameters. APE processor 590 is configured to determine the sensor response function based on the change between different polarizations of illumination beam 504 and/or sub-beams 530, 532 along signal path 535. For example, illumination beam 504 may have an initial linear polarization ($\theta$) of 30°. A first alignment position (e.g., reference alignment position) of diffraction target 520 is measured at $\theta_0$=30° to be $x_0$=5 nm. Polarizing filter 514 adjusts the polarization of illumination beam 504 from 30° to 45°, and a second alignment position of diffraction target 520 is measured at $\theta_1$=45° to be $x_1$=8 nm. Assuming APE is a linear function of polarization, a sensor response function based on the change between different polarizations is calculated by APE processor 590, such that the sensor response function is $\Delta x/\Delta\theta$=(8 nm−5 nm)/(45°−30°)=0.2 or APE=(0.2)·$\Delta\theta$ (nm/°).

In some embodiments, alignment sensor apparatus 500 may include beam analyzer 536 and/or mark asymmetry reconstruction (MAR) optical branch 540. In some embodiments, as shown in FIG. 5, MAR optical branch 540 may be disposed between spot mirror 516 and polarizing beam splitter 550. MAR optical branch 540 is configured measure and determine asymmetries in diffraction target 520. MAR optical branch 540 may include beam splitter 542 and MAR detector 546. Beam splitter 542 reflects a portion of sub-beams 530, 532 along signal path 535 and transmits a remaining portion of sub-beams 530, 532 along signal path 535 toward polarizing beam splitter 550. In some embodiments, as shown in FIG. 5, MAR optical branch 540 may include optical filter 544. For example, optical filter 544 may be a patterned reticle and/or reference pattern. In some embodiments, MAR detector 546 is coupled to beam analyzer 536 via control signal 598. For example, MAR detector 546 can receive and incorporate reference values for various parameters of illumination beam 504, 534 and/or first diffraction order sub-beam 528 measured by beam analyzer 536, and optimize the asymmetries detected for diffraction target 520 based on these reference values In some embodiments, APE processor 590 is coupled to beam analyzer 536 via control signal 596. For example, APE processor 590 can receive and incorporate reference values for various parameters of illumination beam 504, 534 and/or first diffraction order sub-beam 528 measured by beam analyzer 536, and optimize the alignment position and/or sensor response function based on these reference values. In some embodiments, APE processor 590 is coupled to MAR detector 546 via control signal 594. For example, APE processor 590 can receive and incorporate asymmetry values of diffraction target 520 measured by MAR detector 546, and optimize the alignment position and/or sensor response function based on these asymmetry values.

Exemplary Flow Diagram

Figure 6:
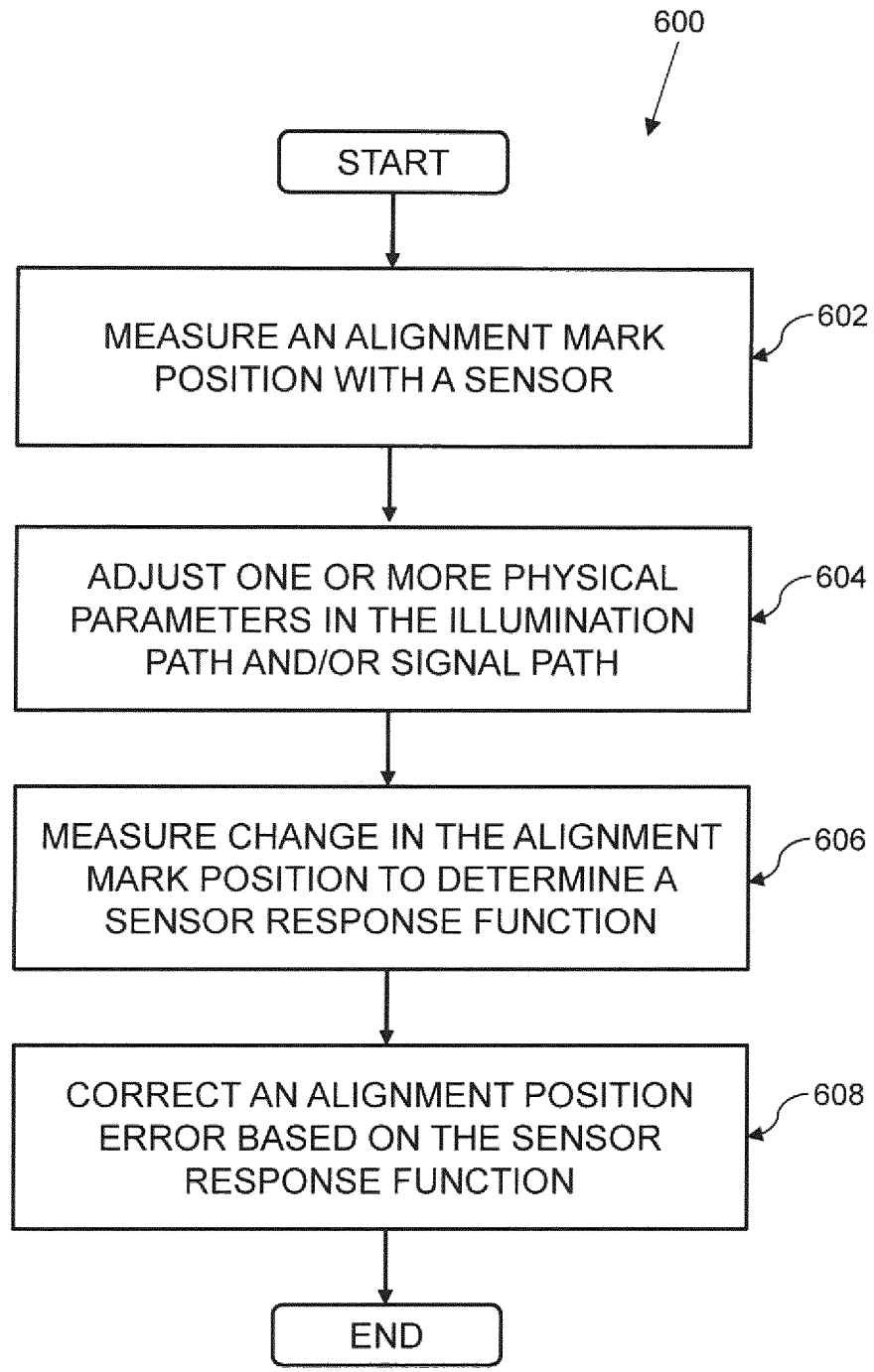
FIG. 6 illustrates a flow diagram for correcting alignment position error, according to an exemplary embodiment.

FIG. 6 illustrates flow diagram 600 for correcting APE, according to an embodiment. It is to be appreciated that not all steps in FIG. 6 may be needed to perform the disclosure provided herein. Further, some of the steps may be performed simultaneously, or in a different order than shown in FIG. 6. Flow diagram 600 shall be described with reference to FIG. 5. However, flow diagram 600 is not limited to those example embodiments.

In step 602, as shown in the example of FIG. 5, an initial (e.g., reference) alignment mark position of diffraction target 520 is measured. Illumination system 502 is configured to transmit illumination beam 504 along an illumination path toward spot mirror 516. Spot mirror 516 may transmit illumination beam 504 toward focusing lens 518, which focuses illumination beam 504 on diffraction target 520 on substrate 522. Focused illumination beam 504 on diffraction target 520 creates a signal beam along signal path 535 comprising diffraction order sub-beams 528, 530, 532 reflected from diffraction target 520. Second and third diffraction order sub-beams 530, 532 transmit along signal path 535 to polarizing beam splitter 550. Polarizing beam splitter 550 splits signal path 535 into orthogonal polarization components (i.e., first and second polarization optical branches), and transmits s-polarized sub-beams 530, 532 into first polarization optical branch ("X" direction, s-polarized) and transmits p-polarized sub-beams 530, 532 into second polarization optical branch ("Y" direction, p-polarized). First polarization optical branch is configured to transmit s-polarized sub-beams 530, 532 and measure any change, shift, and/or deviation in an alignment position of diffraction target 520 in a horizontal or "X" direction, with reference to alignment axis 526. Second polarization optical branch is similar to first polarization optical branch, and is configured to transmit p-polarized sub-beams 530, 532 and measure any change, shift, and/or deviation in an alignment position of diffraction target 520 in a vertical or "Y" direction, with reference to alignment axis 526. Detector controller 584 is configured to measure and detect an alignment position of diffraction target 520, with reference to alignment axis 526, based on the signal beams (e.g., difference and sum) outputted from the first and second polarization branches. In some embodiments, detector controller 584 is configured to measure any change, shift, and/or deviation in an alignment position of diffraction target 520 in a horizontal or "X" direction and/or in a vertical or "Y" direction.

In step 604, as shown in the example of FIG. 5, one or more physical parameters in illumination beam 504 and/or diffraction order sub-beams 528, 530, 532 along signal path 535 is adjusted by one or more optical filters 506, 508, 510, 512, 514, 538, 548, 560, 576. When one or more physical parameters of illumination beam 504 and/or sub-beams 530, 532 along signal path 535 is adjusted, a change, shift, and/or deviation in the reference alignment position of diffraction target 520 occurs. One or more optical filters may include spectral filter 506, numerical aperture (NA) filter 508, neutral density (ND) filter 510, patterned filter 512, and/or polarizing filter 514.

In embodiments, spectral filter 506 may include a bandpass filter, a bandpass interference filter, a notch filter, a shortpass filter, a longpass filter, a step filter, and/or a dichroic filter. In some embodiments, NA filter 508 may include a lens, an objective, and/or a prism configured to change an optical power and/or beam shape of illumination beam 504 and/or sub-beams 530, 532 along signal path 535. In some embodiments, ND filter 510 may be configured to change an intensity and/or spot size of illumination beam 504 and/or sub-beams 530, 532 along signal path 535. In some embodiments, patterned filter 512 may include a patterned reticle and/or reference pattern disposed in illumination beam 504 and/or sub-beams 530, 532 along signal path 535. In some embodiments, polarizing filter 514 may include a waveplate disposed in illumination beam 504 and/or sub-beams 530, 532 along signal path 535. For example, polarizing filter 514 may be a half-wave plate or a quarter-wave plate.

In some embodiments, as shown in FIG. 5, one or more optical filters 506, 508, 510, 512, 514 may be disposed in illumination beam 504 and/or sub-beams 530, 532 along signal path 535 at various positions, including but not limited to optical filter 538, optical filter 544, optical filter 548, optical filter 560, and/or optical filter 576. For example, optical filter 538 may be a waveplate. For example, optical filter 560 may be a patterned reticle and/or reference pattern. For example, optical filter 544 may be a patterned reticle and/or reference pattern.

In step 606, a subsequent (e.g., modified) alignment mark position of diffraction target 520 is measured due to a change in the alignment mark position caused by one or more optical filters 506, 508, 510, 512, 514, 538, 548, 560, 576 to determine a sensor response function. The subsequent measurement process in step 606 is similar to that described in step 602. APE processor 590 is configured to measure a change, shift, and/or deviation in an alignment position of diffraction target 520 caused by one or more optical filters 506, 508, 510, 512, 514, 538, 544, 548, 560, 576, as described in step 604, being disposed in illumination beam 504 and/or diffraction order sub-beams 528, 530, 532 along signal path 535. APE processor 590 receives measured alignment position values from detector controller 584 to calculate a reference (i.e., calibrated) alignment position for diffraction target 520 and receives a subsequent (i.e., modified) alignment position for diffraction target 520, and calculates any change between the two measured alignment positions. Based on the change, APE processor 590 determines a sensor response function of alignment sensor apparatus 500 as a function of the one or more optical filters 506, 508, 510, 512, 514, 538, 544, 548, 560, 576. In some embodiments, the sensor response function is calculated by APE processor 590 based on a linear model. In some embodiments, the sensor response function is calculated by APE processor 590 based on a non-linear model.

In an embodiment, after detector controller 584 and/or APE processor 590 determines a reference (i.e., calibrated) alignment position for diffraction target 520, spectral filter 506 is disposed in illumination beam 504 and/or sub-beams 530, 532 along signal path 535 to adjust one or more physical parameters. APE processor 590 is configured to determine the sensor response function based on the change between different wavelengths of illumination beam 504 and/or sub-beams 530, 532 along signal path 535.

In an embodiment, after detector controller 584 and/or APE processor 590 determines a reference (i.e., calibrated) alignment position for diffraction target 520, NA filter 508 is disposed in illumination beam 504 and/or sub-beams 530, 532 along signal path 535 to adjust one or more physical parameters. APE processor 590 is configured to determine the sensor response function based on the change between one or more different diffraction order sub-beams 528, 530, 532 along signal path 535.

In an embodiment, after detector controller 584 and/or APE processor 590 determines a reference (i.e., calibrated) alignment position for diffraction target 520, polarizing filter 514 is disposed in illumination beam 504 and/or sub-beams 530, 532 along signal path 535 to adjust one or more physical parameters. APE processor 590 is configured to determine the sensor response function based on the change between different polarizations of illumination beam 504 and/or sub-beams 530, 532 along signal path 535.

In step 608, based on the sensor response function, APE processor 590 corrects an alignment position error (APE). In some embodiments, APE processor 590 is configured to correct an APE by calculating a derivative and/or a minimum value of the sensor response function for one or more physical parameters. In some embodiments, APE processor 590 corrects an APE of alignment sensor apparatus 500, lithographic apparatus 100 and/or 100', lithocell 300, alignment apparatus 400, and/or other optical systems, based on the sensor response function.

In some embodiments, a basic correction calibration is performed on alignment sensor apparatus 500 using monitor wafers. Monitor wafers have been previously exposed using a special reticle containing special scatterometry marks. According to an embodiment, at least one of the monitor wafers is substrate 522. APE processor 590 may create a basic correction algorithm based on the information received from detector controller 584, beam analyzer 536, and/or MAR detector 546, including but not limited to the optical state of illumination beam 504, alignment signals, and associated position estimates, and optical state in the pupil, image, and additional planes. APE processor 590 may utilize the basic correction algorithm to characterize alignment sensor apparatus 500 with reference to wafer marks, for example, diffraction target 520.

In some embodiments, basic alignment system calibration is performed on alignment sensor apparatus 500 using process wafers. APE processor 590 may update the basic correction algorithm and characterize alignment sensor apparatus 500 with reference to wafer marks, for example, diffraction target 520, based on the information received from detector controller 584, beam analyzer 536, and/or MAR detector 546, including but not limited to the optical state of illumination beam 504, alignment signals, and associated position estimates, and optical state in the pupil, image, and additional planes.

In some embodiments, APE processor 590 may determine printed pattern position offset errors on process wafers with respect to the sensor estimate for each mark based on the information received from detector controller 584, beam analyzer 536, and/or MAR detector 546. APE processor 590 may utilize a clustering algorithm to group the marks into sets of similar constant offset error, and create an alignment error offset correction table based on the information. APE processor 590 may also utilize calibration information obtained from steps 602 and 606 to determine corrections for each mark.

In some embodiments, APE processor 590 may feed corrections back to lithographic apparatus 100 and/or 100' and/or alignment sensor apparatus 500 for correcting errors in the overlay offset, for example, by feeding corrections into alignment sensor apparatus 500 and processing substrate 522 using the calibrated system and/or the sensor response function. Substrate 522 may be processed using known manufacturing processes by a lithographic projection apparatus, and a pattern (e.g., overlay marker or a product pattern in a reticle) is imaged onto substrate 522 that is at least partially covered by a layer of radiation-sensitive material (resist). Prior to this imaging, substrate 522 may undergo various procedures, such as priming, resist coating, and a soft bake. Substrate 522 may be aligned in calibrated alignment sensor apparatus 500 prior to exposure. After exposure, substrate 522 may be subjected to other procedures, such as a post-exposure bake (PEB), development, a hard bake, and measurement/inspection of the imaged features. Thus, substrate 522 is exposed with an overlay marker along with a product pattern and the resist is developed to print the overlay marker on the stacked wafer.

In some embodiments, APE processor 590 may measure printed pattern position offset error with respect to the sensor estimate for each alignment mark or diffraction target 520 on exposed substrate 522. The measurement information includes but is not limited to the product stack profile, measurements of overlay, critical dimension, and focus of each alignment mark or diffraction target 520 on substrate 522. APE processor 590 may utilize a clustering algorithm to group the marks into sets of similar constant offset errors, and create an alignment error offset correction table based on the information. The clustering algorithm may be based on overlay measurement, the position estimates, and additional optical stack process information associated with each set of offset errors. From this measured overlay and the known programmed overlay of its corresponding target, the overlay error can be deduced.

In some embodiments, APE processor 590 may determine corrections for each mark and feed corrections back to lithographic apparatus 100 and/or 100' and/or alignment sensor apparatus 500 for correcting errors in the overlay, for example, by feeding corrections into alignment sensor apparatus 500. Thus, the process creates a self-learning feedback loop for calibrating alignment sensor apparatus 500.

Exemplary Alignment Sensor Apparatuses (Center of Gravity Shift)

As discussed above, OPAEs are caused by varying stack thicknesses, materials, and/or processes on each wafer (i.e., process variations) and overlay errors due to the interaction between alignment sensors. Process variations change the optical properties of reflected light from an alignment mark on a substrate, which causes OPAEs. Asymmetry variations in an alignment target from processing can cause alignment errors as large as several nanometers and are difficult to predict or calibrate. Further, diffraction based alignment apparatus optics cannot differentiate between phase offsets induced by asymmetry variations in an alignment target and phase differences among diffraction orders of the alignment target.

One method to indirectly measure asymmetry in a diffraction target is to monitor a center of gravity of the diffraction target. When an illumination beam is directed or focused toward a diffraction target a signal beam is created having an irradiance distribution. The irradiance distribution includes diffraction order sub-beams reflected from or produced by the diffraction target. Each diffraction order sub-beam has a diffraction order distribution. For a symmetric diffraction target, the center of gravity or centroid of the diffraction order distribution is centered on the diffraction order sub-beam. For an asymmetric diffraction target, a non-symmetric (i.e., asymmetric) shift in the center of gravity of the diffraction order distribution occurs. By measuring this non-symmetric center of gravity shift, one can determine a sensor response function of the system and correct an alignment position error.

Figure 7:
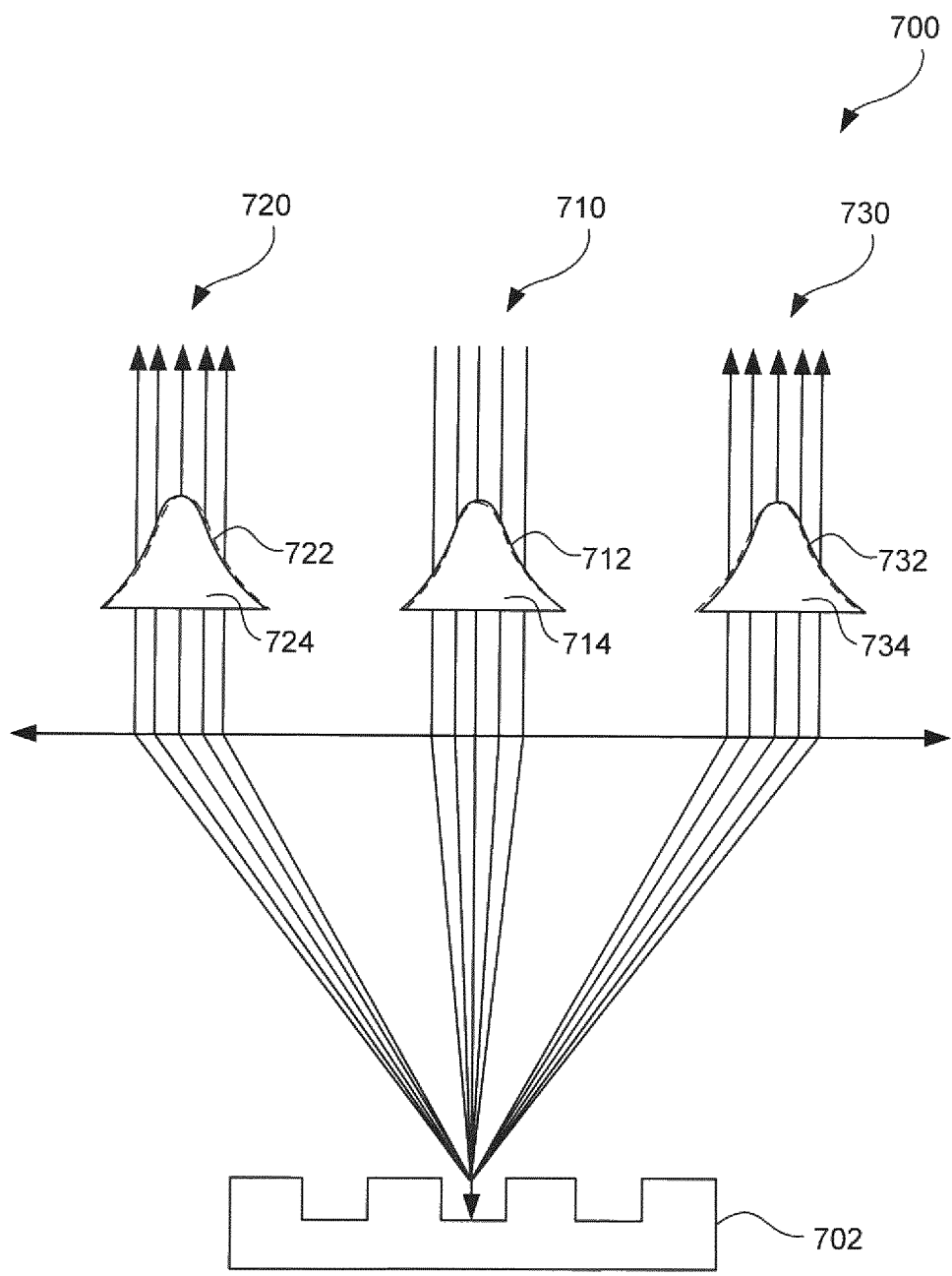
FIG. 7 is a schematic illustration of an irradiance distribution in an alignment sensor apparatus, according to an exemplary embodiment.
Figure 8:
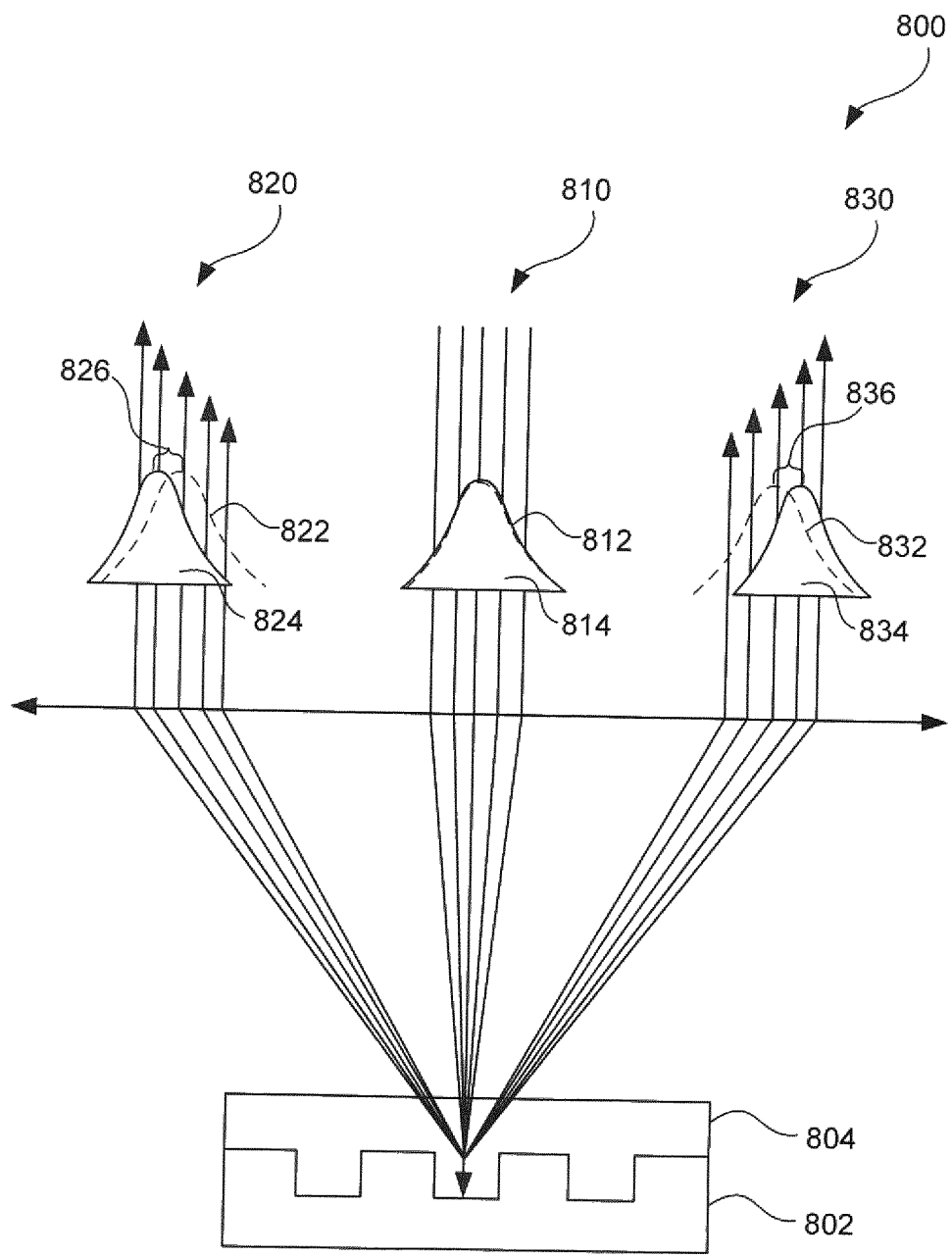
FIG. 8 is a schematic illustration of an irradiance distribution in an alignment sensor apparatus, according to an exemplary embodiment.
Figure 9:
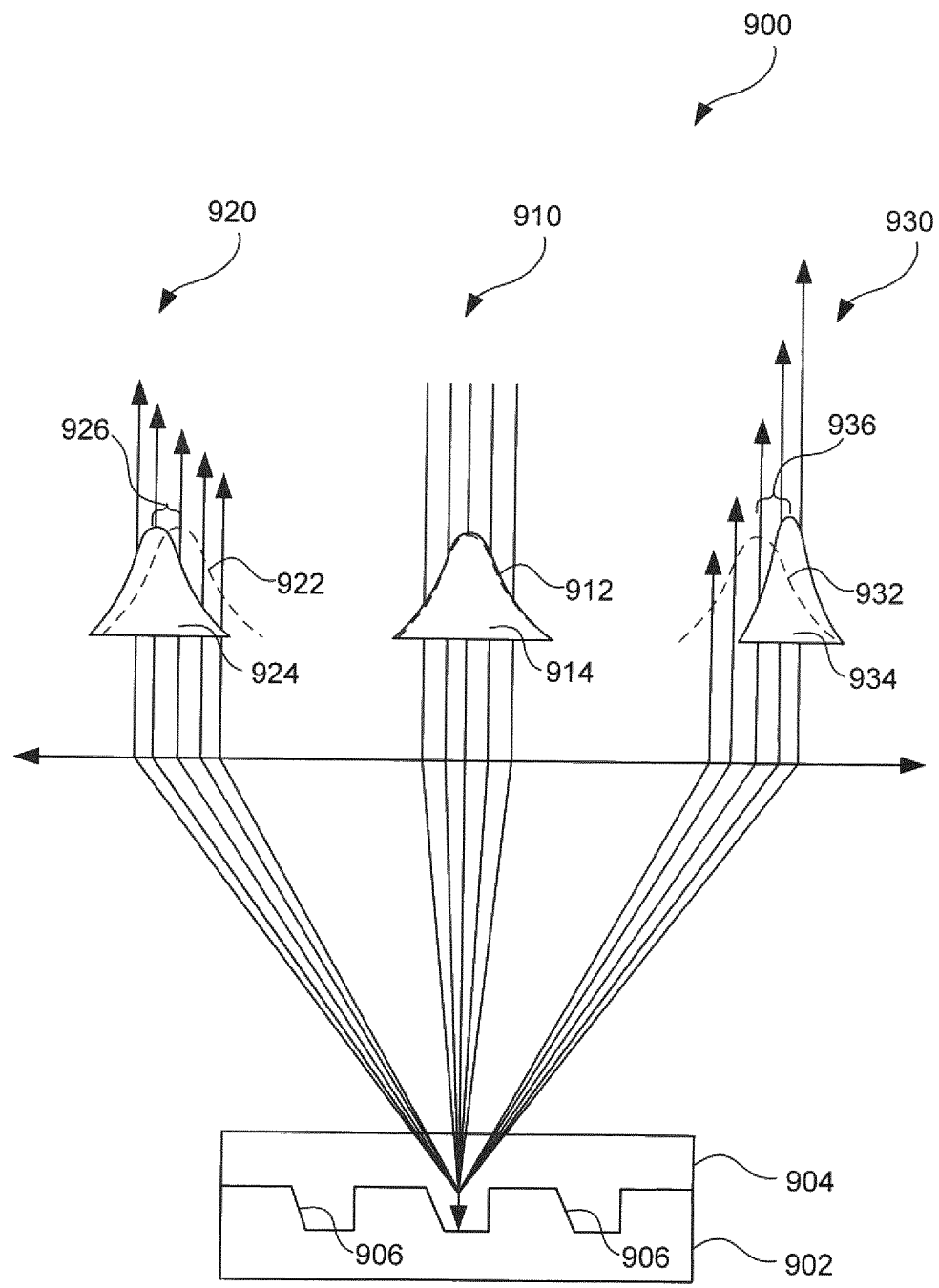
FIG. 9 is a schematic illustration of an irradiance distribution in an alignment sensor apparatus, according to an exemplary embodiment.

FIGS. 7 through 9 illustrate various irradiance distributions 700, 800, 900 from different diffraction targets 702, 802, 902, respectively, according to various exemplary embodiments. Irradiance distributions 700, 800, 900 can be produced, detected, and measured in alignment sensor apparatus 500 (i.e., shown in FIG. 5) or in a similar alignment sensor apparatus (e.g., alignment apparatus 400 shown in FIGS. 4A and 4B). Although irradiance distributions 700, 800, 900 are described below with reference to alignment sensor apparatus 500 as shown in FIG. 5, the embodiments of this disclosure are not limited to this example, and embodiments of irradiance distributions 700, 800, 900 of this disclosure can be used with other optical systems, such as, but not limited to, lithographic apparatus 100 and/or 100', lithocell 300, alignment apparatus 400, and/or other optical systems.

As shown in FIG. 7, irradiance distribution 700 is symmetric and produced from symmetric diffraction target 702 with small angular reflectivity. Symmetric diffraction target 702 shown in FIG. 7 is similar to diffraction target 520 shown in FIG. 5 or alignment mark or target 418 shown in FIGS. 4A and 4B. Irradiance distribution 700 includes first diffraction order sub-beam 710, second diffraction order sub-beam 720, and third diffraction order sub-beam 730. First, second, and third diffraction order sub-beams 710, 720, 730 are similar to first, second, and third diffraction order sub-beams 528, 530, 532 of alignment sensor apparatus 500 (i.e., shown in FIG. 5). First diffraction order sub-beam 710 has first diffraction order distribution 714 with center of gravity 712. Second diffraction order sub-beam 720 has second diffraction order distribution 724 with center of gravity 722. Third diffraction order sub-beam 730 has third diffraction order distribution 734 with center of gravity 732.

As shown in FIG. 8, irradiance distribution 800 is symmetric and produced from symmetric diffraction target 802 and overlay layer 804 with large angular reflectivity. Symmetric diffraction target 802 shown in FIG. 8 is similar to diffraction target 520 shown in FIG. 5 or alignment mark or target 418 shown in FIGS. 4A and 4B. Irradiance distribution 800 includes first diffraction order sub-beam 810, second diffraction order sub-beam 820, and third diffraction order sub-beam 830. First, second, and third diffraction order sub-beams 810, 820, 830 are similar to first, second, and third diffraction order sub-beams 528, 530, 532 of alignment sensor apparatus 500 (i.e., shown in FIG. 5). First diffraction order sub-beam 810 has first diffraction order distribution 814 with center of gravity 812. Second diffraction order sub-beam 820 has second diffraction order distribution 824 which is shifted from center of gravity 822 (i.e., center of gravity 722 as shown in FIG. 7), indicated by center of gravity shift 826. Third diffraction order sub-beam 830 has third diffraction order distribution 834 which is shifted from center of gravity 832 (i.e., center of gravity 732 as shown in FIG. 7), indicated by center of gravity shift 836. Overlay layer 804 contributes to a larger angular reflectivity which causes second and third diffraction order sub-beams 820, 830 to be displaced symmetrically. Hence, first and second diffraction order distributions 824, 834 are displaced symmetrically.

As shown in FIG. 9, irradiance distribution 900 is non-symmetric (i.e., asymmetric) and produced from asymmetric diffraction target 902 and overlay layer 904 with large angular reflectivity. Asymmetric diffraction target 902 shown in FIG. 9 is similar to diffraction target 520 shown in FIG. 5 or alignment mark or target 418 shown in FIGS. 4A and 4B. Irradiance distribution 900 includes first diffraction order sub-beam 910, second diffraction order sub-beam 920, and third diffraction order sub-beam 930. First, second, and third diffraction order sub-beams 910, 920, 930 are similar to first, second, and third diffraction order sub-beams 528, 530, 532 of alignment sensor apparatus 500 (i.e., shown in FIG. 5).

First diffraction order sub-beam 910 has first diffraction order distribution 914 with center of gravity 912. Second diffraction order sub-beam 920 has second diffraction order distribution 924 which is shifted from center of gravity 922 (i.e., center of gravity 822 as shown in FIG. 8), indicated by center of gravity shift 926. Third diffraction order sub-beam 930 has third diffraction order distribution 934 which is non-symmetrically shifted from center of gravity 932 (i.e., center of gravity 832 as shown in FIG. 8), indicated by center of gravity shift 936. Overlay layer 904 contributes to a larger angular reflectivity which causes second and third diffraction order sub-beams 820, 830 to be displaced symmetrically. However, asymmetry variation 906 in asymmetric diffraction target 902 causes third diffraction order sub-beam 930 to be displaced non-symmetrically (i.e., asymmetrically). Hence, first and second diffraction order distributions 924, 934 are displaced non-symmetrically (i.e., asymmetrically), as indicated by center of gravity shifts 926, 936, respectively. As shown in FIG. 9, for example, center of gravity shift 936 is greater than center of gravity shift 926. This non-symmetric (i.e., asymmetric) center of gravity shifts 926, 936 between first and second diffraction order distributions 924, 934, respectively, can be correlated to an aligned position to determine an alignment position error and/or a sensor response function of the system.

In some embodiments, detector controller 584 and first, second, third, and/or fourth position detectors 564, 566, 582, 580 of alignment sensor apparatus 500 can be configured to measure a center of gravity 712, 722, 732 of irradiance distribution 700, a center of gravity 812, 822, 832 of irradiance distribution 800, and/or a center of gravity 912, 922, 932 of irradiance distribution 900. In some embodiments, APE processor 590 can be configured to measure a shift in the center of gravity 724, 734 of irradiance distribution 700, a shift in the center of gravity 824, 834 of irradiance distribution 800, and/or a shift in the center of gravity 924, 934 of irradiance distribution 900. For example, center of gravity shift 826, center of gravity shift 836, center of gravity shift 926, and/or center of gravity shift 936. In some embodiments, APE processor 590 can be configured to determine a sensor response function of alignment sensor apparatus 500 based on a shift in the center of gravity 724, 734 of irradiance distribution 700, a shift in the center of gravity 824, 834 of irradiance distribution 800, and/or a shift in the center of gravity 924, 934 of irradiance distribution 900. For example, center of gravity shift 826, center of gravity shift 836, center of gravity shift 926, and/or center of gravity shift 936. In some embodiments, APE processor 590 can be configured to correct an alignment position error of alignment sensor apparatus 500 based on the sensor response function. For example, APE processor 590 can correct the alignment position error by calculating a first center of gravity shift 926 between center of gravity 922 and second diffraction order distribution 924 and a second center of gravity shift 936 between center of gravity 932 and third diffraction order distribution 934. In some embodiments, first and second gravity shifts can be calculated as a function of one or more wavelengths of the illumination beam. For example, first and second gravity shifts 926, 936 can be calculated as a function of wavelengths of about 532 nm, 636 nm, 780 nm, and/or 850 nm.

In some embodiments, asymmetry variation 906 can include an asymmetric side wall, an asymmetric bottom surface, and/or an asymmetric top surface. For example, as shown in FIG. 9, asymmetry variation 906 can be an angled side wall. In some embodiments, asymmetry variation 906 can include an angled side wall, an angled bottom surface, and/or an angled top surface. For example, asymmetry variation 906 can be an angled side wall having an angle of about 0 degrees to about 10 degrees, an angled bottom surface having an angle of about 0 degrees to about 5 degrees, and/or an angled top surface having an angle of about 0 degrees to about 10 degrees.

Figure 10A:
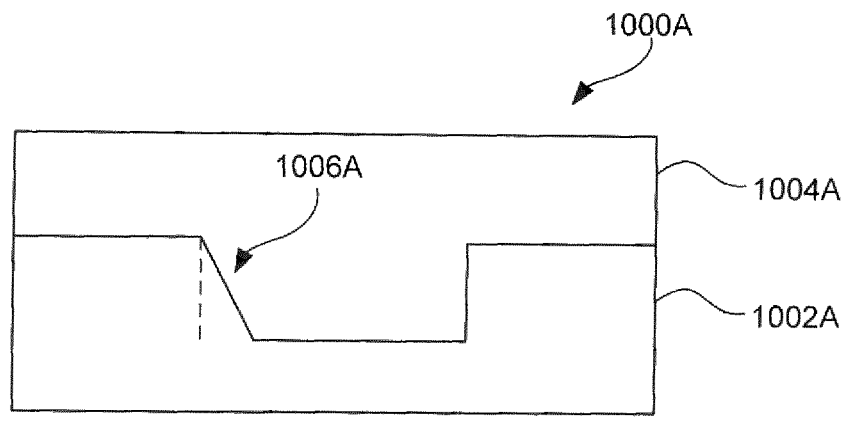
FIGS. 10A-10C are schematic illustrations of asymmetry variations of diffraction targets, according to various exemplary embodiments.
Figure 10B:
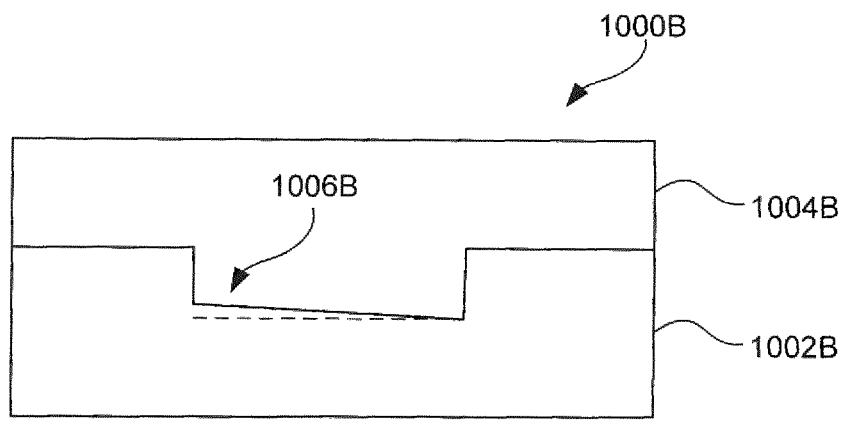
Figure 10C:
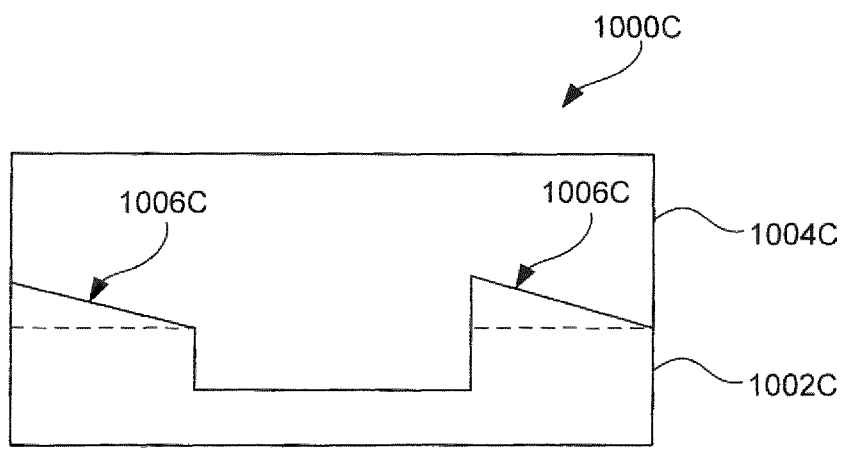

FIGS. 10A through 10C illustrate various asymmetric diffraction stacks 1000A, 1000B, 1000C, respectively, according to various exemplary embodiments. Asymmetric diffraction stacks 1000A, 1000B, 1000C shown in FIGS. 10A, 10B, and 10C, respectively, are similar to diffraction target 902 and overlay layer 904 shown in FIG. 9. Further, asymmetry variations 1006A, 1006C, 1006C shown in FIGS. 10A, 10B, and 10C, respectively, are similar to asymmetry variation 906 shown in FIG. 9.

As shown in FIG. 10A, asymmetric diffraction stack 1000A includes diffraction target 1002A and overlay layer 1004A. Diffraction target 1002A includes asymmetry variation 1006A. Asymmetry variation 1006A is an angled side wall. In some embodiments, asymmetry variation 1006A can be an angled side wall having an angle of about 0 degrees to about 45 degrees. For example, asymmetry variation 1006A can be an angled side wall having an angle of about 1 degrees to about 15 degrees.

As shown in FIG. 10B, asymmetric diffraction stack 1000B includes diffraction target 1002B and overlay layer 1004B. Diffraction target 1002B includes asymmetry variation 1006B. Asymmetry variation 1006B is an angled bottom surface. In some embodiments, asymmetry variation 1006B can be an angled bottom surface having an angle of about 0 degrees to about 30 degrees. For example, asymmetry variation 1006B can be an angled bottom surface having an angle of about 1 degrees to about 10 degrees.

As shown in FIG. 10C, asymmetric diffraction stack 1000C includes diffraction target 1002C and overlay layer 1004C. Diffraction target 1002B includes asymmetry variation 1006C. Asymmetry variation 1006B is an angled top surface. In some embodiments, asymmetry variation 1006C can be an angled top surface having an angle of about 0 degrees to about 45 degrees. For example, asymmetry variation 1006C can be an angled bottom surface having an angle of about 1 degrees to about 15 degrees.

FIGS. 11A through 11D illustrate various center of gravity shift plots 1100A, 1100B, 1100C, 1100D for different asymmetry variations as a function of wavelength, respectively, according to various exemplary embodiments. Center of gravity shift plots 1100A, 1100B, 1100C, 1100D shown in FIGS. 11A, 11B, 11C, and 11D, respectively, are similar to center of gravity shifts 826, 836 shown in FIG. 8 and center of gravity shifts 926, 936 shown in FIG. 9. Further, asymmetry variations for center of gravity shift plots 1100A, 1100B, 1100C, 1100D shown in FIGS. 11A, 11B, 11C, and 11D, respectively, are similar to asymmetry variation 906 shown in FIG. 9 and asymmetry variation 1006A shown in FIG. 10A.

Figure 11A:
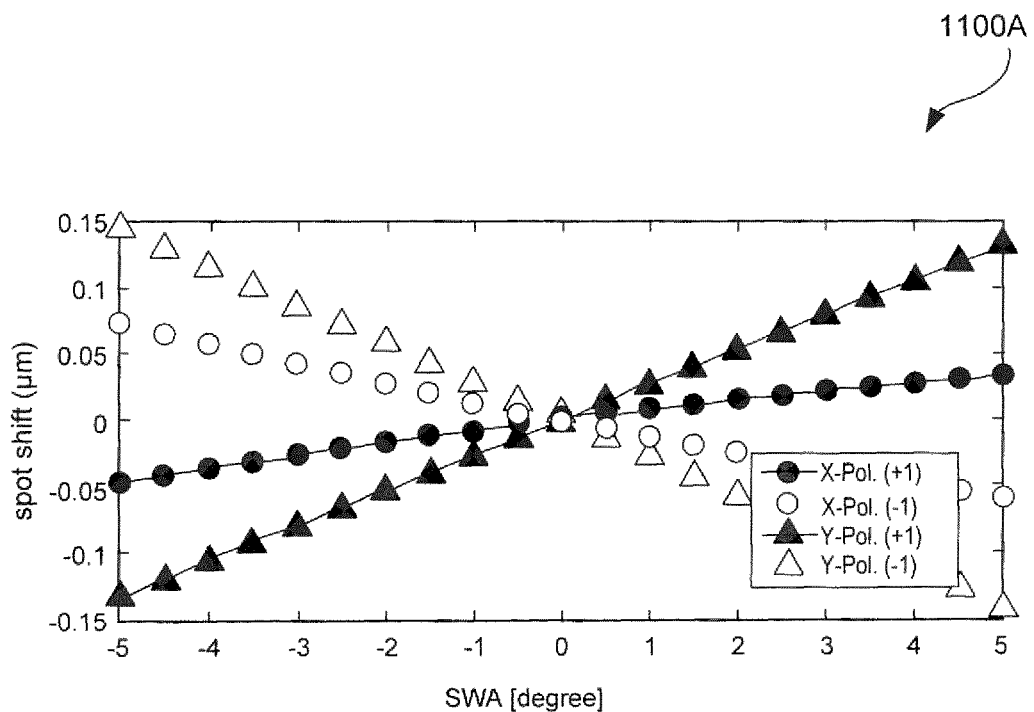
FIGS. 11A-11D are schematic illustrations of center of gravity shifts for different asymmetry variations as a function of wavelength, according to various exemplary embodiments.

As shown in FIG. 11A, center of gravity shift plot 1100A is for different side wall angle (SWA) asymmetry variations for a wavelength of about 532 nm. Center of gravity shift plot 1100A plots center of gravity shift (i.e., spot size shift) versus SWA. In some embodiments, SWA can be about −5 degrees to about 5 degrees. Center of gravity shift plot 1100A includes four types of measurement signals based on polarization, for example, X-polarization (+1), X-polarization (−1), Y-polarization (+1), and Y-polarization (−1). The four types of measurement signals (e.g., X-Pol. (−1), X-Pol. (+1), Y-Pol. (+1), Y-Pol. (−1)) shown in FIG. 11A, are similar to second and third diffraction order sub-beams 920, 930 shown in FIG. 9 and second and third diffraction order sub-beams 530, 532 shown in FIG. 5. As shown in FIG. 11A, the center of gravity shift is non-symmetric (i.e., asymmetric) between X-Pol. (−1) and X-Pol. (+1), and between Y-Pol. (+1) and Y-Pol. (−1), respectively.

Figure 11B:
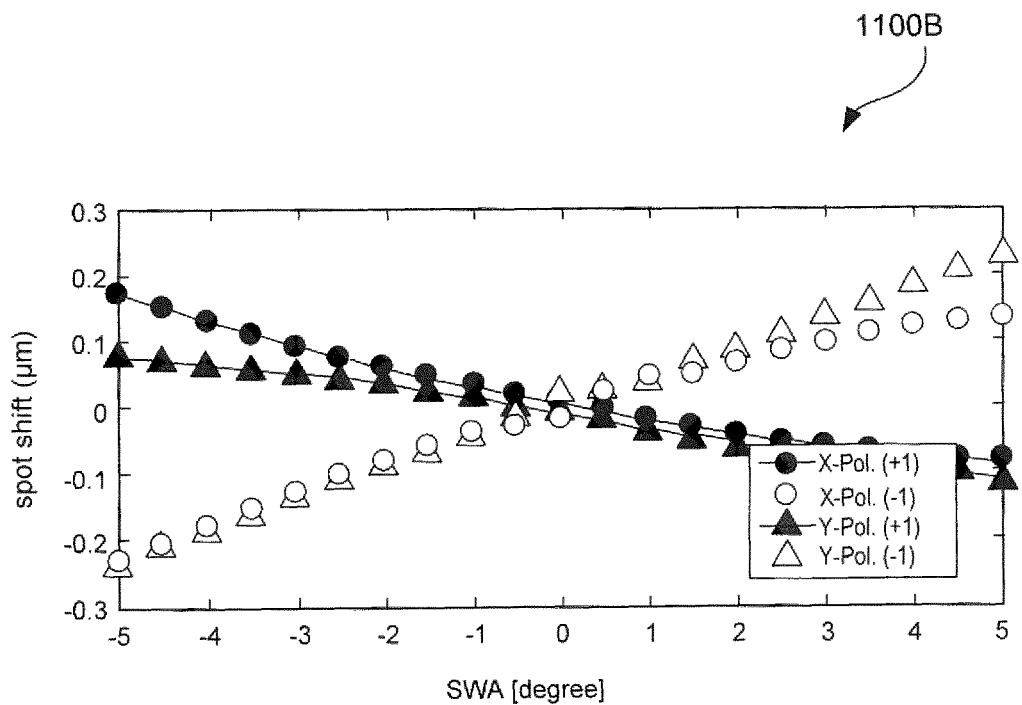

As shown in FIG. 11B, center of gravity shift plot 1100B is for different SWA asymmetry variations for a wavelength of about 636 nm. Center of gravity shift plot 1100B plots center of gravity shift (i.e., spot size shift) versus SWA. In some embodiments, SWA can be about −5 degrees to about 5 degrees. Center of gravity shift plot 1100B includes four types of measurement signals based on polarization, for example, X-polarization (+1), X-polarization (−1), Y-polarization (+1), and Y-polarization (−1). The four types of measurement signals (e.g., X-Pol. (−1), X-Pol. (+1), Y-Pol. (+1), Y-Pol. (−1)) shown in FIG. 11B, are similar to second and third diffraction order sub-beams 920, 930 shown in FIG. 9 and second and third diffraction order sub-beams 530, 532 shown in FIG. 5. As shown in FIG. 11B, the center of gravity shift is non-symmetric (i.e., asymmetric) between X-Pol. (−1) and X-Pol. (+1), and between Y-Pol. (+1) and Y-Pol. (−1), respectively.

Figure 11C:
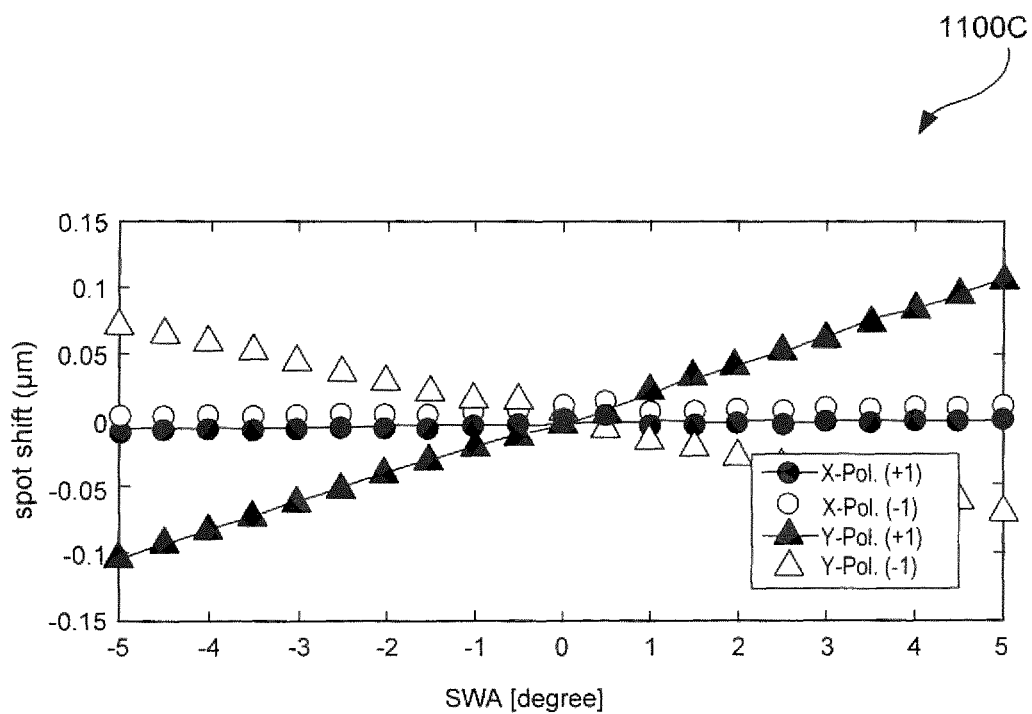

As shown in FIG. 11C, center of gravity shift plot 1100C is for different SWA asymmetry variations for a wavelength of about 780 nm. Center of gravity shift plot 1100C plots center of gravity shift (i.e., spot size shift) versus SWA. In some embodiments, SWA can be about −5 degrees to about 5 degrees. Center of gravity shift plot 1100C includes four types of measurement signals based on polarization, for example, X-polarization (+1), X-polarization (−1), Y-polarization (+1), and Y-polarization (−1). The four types of measurement signals (e.g., X-Pol. (−1), X-Pol. (+1), Y-Pol. (+1), Y-Pol. (−1)) shown in FIG. 11C, are similar to second and third diffraction order sub-beams 920, 930 shown in FIG. 9 and second and third diffraction order sub-beams 530, 532 shown in FIG. 5. As shown in FIG. 11C, the center of gravity shift is non-symmetric (i.e., asymmetric) between X-Pol. (−1) and X-Pol. (+1), and between Y-Pol. (+1) and Y-Pol. (−1), respectively.

Figure 11D:
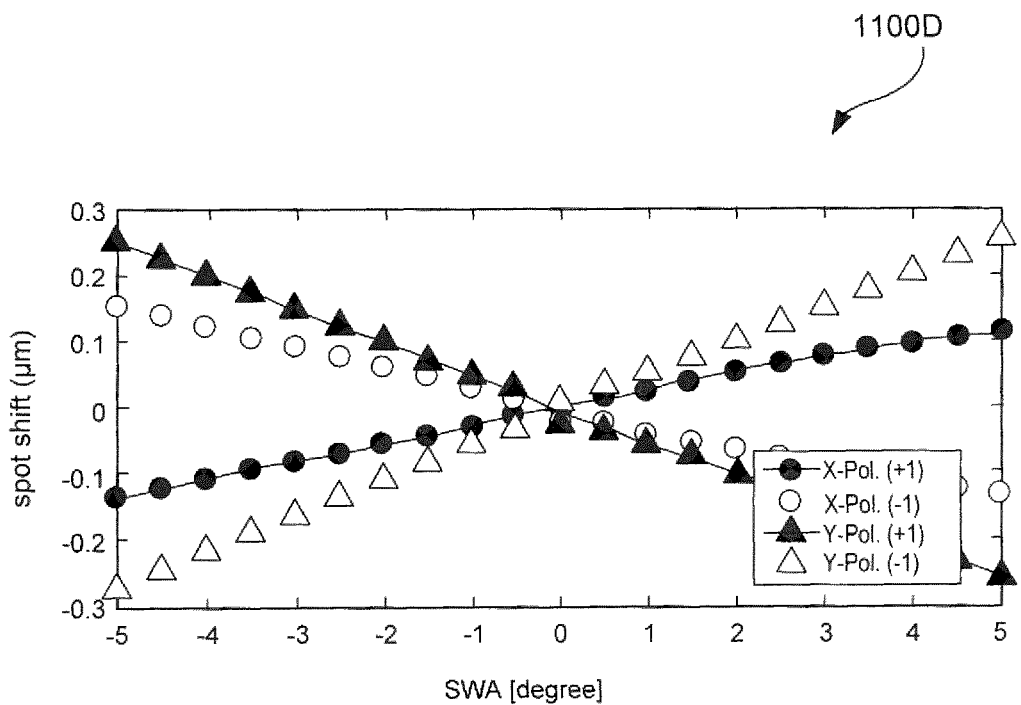

As shown in FIG. 11D, center of gravity shift plot 1100D is for different SWA asymmetry variations for a wavelength of about 850 nm. Center of gravity shift plot 1100D plots center of gravity shift (i.e., spot size shift) versus SWA. In some embodiments, SWA can be about −5 degrees to about 5 degrees. Center of gravity shift plot 1100B includes four types of measurement signals based on polarization, for example, X-polarization (+1), X-polarization (−1), Y-polarization (+1), and Y-polarization (−1). The four types of measurement signals (e.g., X-Pol. (−1), X-Pol. (+1), Y-Pol. (+1), Y-Pol. (−1)) shown in FIG. 11D, are similar to second and third diffraction order sub-beams 920, 930 shown in FIG. 9 and second and third diffraction order sub-beams 530, 532 shown in FIG. 5. As shown in FIG. 11D, the center of gravity shift is non-symmetric (i.e., asymmetric) between X-Pol. (−1) and X-Pol. (+1), and between Y-Pol. (+1) and Y-Pol. (−1), respectively.

In some embodiments, a non-symmetric (i.e., asymmetric) component of the center of gravity shift for one or more wavelengths can be detected. In some embodiments, a non-symmetric (i.e., asymmetric) change in a central wavelength of the illumination beam can be detected.

Exemplary Pupil Sensor Apparatuses

Another method to indirectly measure asymmetry in a diffraction target is to monitor a pupil plane distribution of the diffraction target. When an illumination beam is directed or focused toward a diffraction target a signal beam is created having an irradiance distribution. The irradiance distribution includes diffraction order sub-beams reflected from or produced by the diffraction target. Each diffraction order sub-beam has a diffraction order distribution. Pupil planes (e.g., entrance pupil, exit pupil) are planes in which the images, both real and virtual, of the optical system's (i.e., alignment sensor apparatus 500 shown in FIG. 5) aperture stop are located. At the pupil plane of the optical system (i.e., optical system's exit pupil), the irradiance distribution is a pupil plane depth distribution (i.e., thickness map) of the diffraction target.

The pupil plane depth distribution can be used in combination with a calibrated distribution, for example, a known aberration map of the optical sensor, to detect and correct for sensor-induced errors and diffraction target asymmetry variations and/or thickness variations of a device stack. If the locations of diffraction order sub-beams and an aberration map of the optical sensor are known, an alignment position of the diffraction target can be corrected. Further, by comparing the location and spread (i.e., center of gravity shift) of diffraction order sub-beams to a known reference diffraction grating (i.e., with identical pitch) the depth variations in the pupil plane distribution can be measured and an alignment position of the diffraction target can be corrected and/or thickness variations of a device stack can be corrected.

Figure 12:
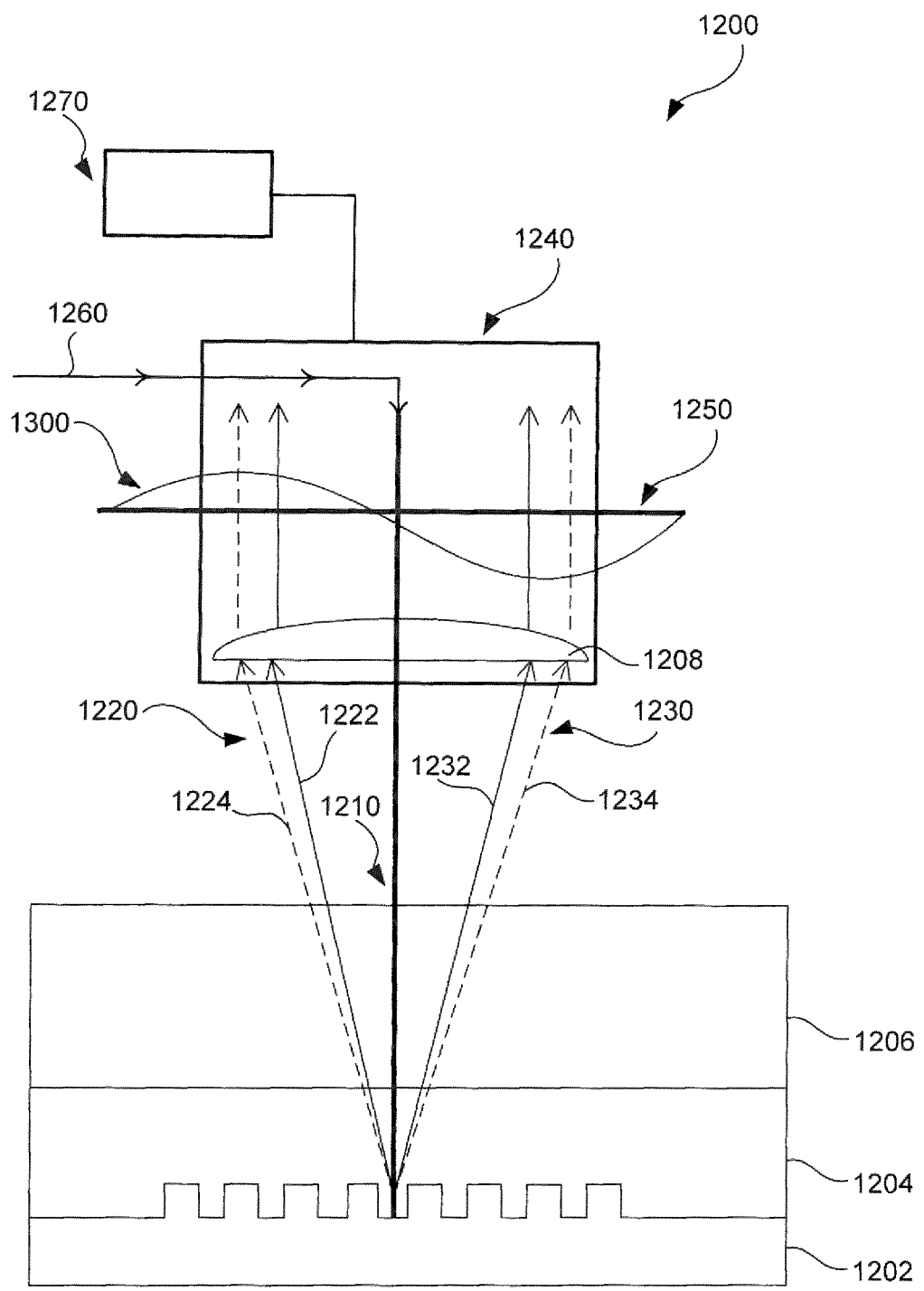
FIG. 12 is a schematic illustration of a pupil sensor apparatus, according to an exemplary embodiment.
Figure 13:
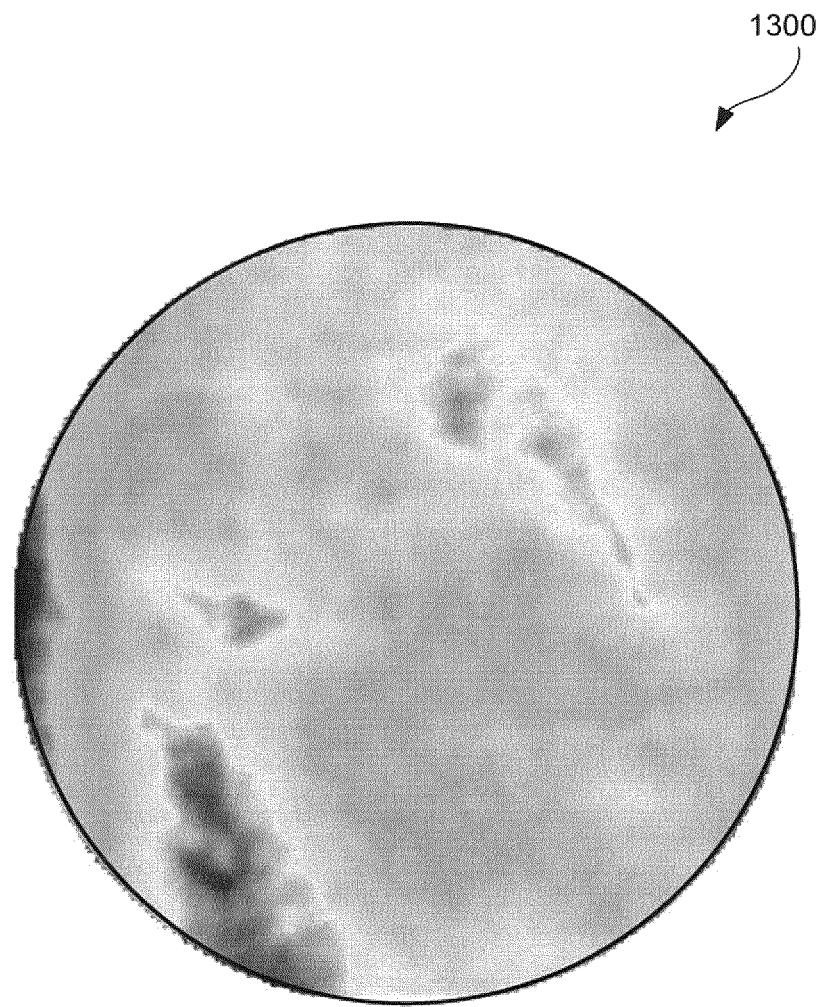
FIG. 13 is a schematic illustration of a pupil plane depth distribution of the pupil sensor apparatus of FIG. 12.

FIGS. 12 and 13 illustrate pupil sensor apparatus 1200 for measuring pupil plane depth distribution 1300, according to an exemplary embodiment. In some embodiments, pupil sensor apparatus 1200 can be implemented in alignment sensor apparatus 500 (i.e., shown in FIG. 5) or in a similar alignment sensor apparatus (e.g., alignment apparatus 400 shown in FIGS. 4A and 4B). For example, pupil sensor apparatus 1200 can be spot mirror 516 of alignment sensor apparatus 500 (i.e., shown in FIG. 5). In some embodiments, pupil sensor apparatus 1200 can be an external stand-alone device (i.e., external to alignment sensor apparatus 500, alignment apparatus 400, or other similar alignment sensor apparatus). Although pupil sensor apparatus 1200 is described below with reference to alignment sensor apparatus 500 as shown in FIG. 5, the embodiments of this disclosure are not limited to this example, and embodiments of pupil sensor apparatus 1200 of this disclosure can be used with other optical systems, such as, but not limited to, lithographic apparatus 100 and/or 100', lithocell 300, alignment apparatus 400, and/or other optical systems, or pupil sensor apparatus 1200 can be, as shown in FIG. 12, a separate stand-alone apparatus.

As shown in FIG. 12, pupil sensor apparatus 1200 includes diffraction target 1202, focusing optic 1208, first diffraction order sub-beam 1210, second diffraction order sub-beam 1220, third diffraction order sub-beam 1230, pupil detector 1240, pupil plane 1250, light source 1260, processor 1270, and pupil plane depth distribution 1300. Pupil sensor apparatus 1200 shown in FIG. 12 is similar to alignment sensor apparatus 500 shown in FIG. 5. Diffraction target 1202 shown in FIG. 12 is similar to diffraction target 520 shown in FIG. 5, alignment mark or target 418 shown in FIGS. 4A and 4B, or symmetric diffraction target 702 shown in FIG. 7. Measured first, second, and third diffraction order sub-beams 1210, 1222, 1232 are similar to first, second, and third diffraction order sub-beams 528, 530, 532 of alignment sensor apparatus 500 (i.e., shown in FIG. 5).

Pupil detector 1240 receives light source 1260 and focuses light source 1260 via focusing optic 1208 onto diffraction target 1202 to produce first, second, and third diffraction order sub-beams 1210, 1220, 1230. Pupil detector 1240 shown in FIG. 12 is similar to detector controller 584 and first, second, third, and/or fourth position detectors 566, 564, 582, 580 shown in FIG. 5. Second diffraction order sub-beam 1220 includes measured second diffraction order sub-beam 1222 and reference diffraction order sub-beam 1224 (i.e., determined by a known reference diffraction grating with identical pitch to diffraction target 1202). Third diffraction order sub-beam 1230 includes measured third diffraction order sub-beam 1232 and reference diffraction order sub-beam 1234 (i.e., determined by a known reference diffraction grating with identical pitch to diffraction target 1202). As shown in FIGS. 12 and 13, pupil plane depth distribution 1300 is produced at pupil plane 1250 of pupil sensor apparatus 1200 by diffraction target 1202, first overlay layer 1204, and second overlay layer 1206 and detected by pupil detector 1240. In some embodiments, first overlay layer 1204 and/or second overlay layer 1206 can be omitted.

First diffraction order sub-beam 1210 and measured second and third diffraction order sub-beams 1222, 1232 produce pupil plane depth distribution 1300 at pupil plane 1250. The differences between measured second diffraction order sub-beam 1222 and reference second diffraction order sub-beam 1224 and measured third diffraction order sub-beam 1232 and reference third diffraction order sub-beam 1234, respectively, can be correlated to determine an alignment position error, stack thickness error, and/or a sensor response function of the system. For example, similar to center of gravity shifts 926, 936 shown in FIG. 9, pupil sensor apparatus 1200 can measure center of gravity shifts of second and third diffraction order sub-beams 1220, 1230 (i.e., compare shift of measured center of gravity from reference center of gravity) to determine an alignment position error, stack thickness error, and/or a sensor response function of the system.

In some embodiments, pupil sensor apparatus 1200 can include processor 1270. Processor 1270 shown in FIG. 12 is similar to APE processor 590 shown in FIG. 5. In some embodiments, pupil sensor apparatus 1200 can be an external stand-alone apparatus. For example, pupil detector 1240 can be an external device configured to measure pupil plane depth distribution 1300. In some embodiments, pupil detector 1240 can be configured to measure a pupil plane depth distribution 1300. In some embodiments, processor 1270 can be configured to measure a shift in pupil plane depth distribution 1300, based on a reference irradiance distribution (i.e., reference second and third diffraction order sub-beams 1224, 1234). For example, the reference irradiance distribution can be based on an aberration map of pupil detector 1240 of pupil sensor apparatus 1200. In some embodiments, processor 1270 can be configured to determine a sensor response function of pupil sensor apparatus 1200 based on a shift in pupil plane depth distribution 1300. In some embodiments, processor 1270 can be configured to correct an alignment position error of pupil sensor apparatus 1200 based on the sensor response function. For example, processor 1270 can correct the alignment position error by calculating a first center of gravity shift between measured second diffraction order sub-beam 1222 and reference second diffraction order sub-beam 1224 (i.e., similar to first center of gravity shift 926 shown in FIG. 9) and a second center of gravity shift between measured second diffraction order sub-beam 1232 and reference second diffraction order sub-beam 1234 (i.e., similar to second center of gravity shift 936 shown in FIG. 9). In some embodiments, first and second gravity shifts (i.e., similar to first and second center of gravity shifts 926, 936 shown in FIG. 9) can be calculated as a function of one or more wavelengths of light source 1260. For example, first and second gravity shifts (i.e., similar to first and second center of gravity shifts 926, 936 shown in FIG. 9) can be calculated as a function of wavelengths of about 532 nm, 636 nm, 780 nm, and/or 850 nm.

In some embodiments, detector controller 584 and first, second, third, and/or fourth position detectors 564, 566, 582, 580 of alignment sensor apparatus 500 can be configured to measure a pupil plane depth distribution 1300. In some embodiments, APE processor 590 can be configured to measure a shift in pupil plane depth distribution 1300, based on a reference irradiance distribution (i.e., reference second and third diffraction order sub-beams 1224, 1234). For example, the reference irradiance distribution can be based on an aberration map of detector controller 584 and first, second, third, and/or fourth position detectors 564, 566, 582, 580 of alignment sensor apparatus 500. In some embodiments, APE processor 590 can be configured to determine a sensor response function of alignment sensor apparatus 500 based on a shift in pupil plane depth distribution 1300. In some embodiments, APE processor 590 can be configured to correct an alignment position error of alignment sensor apparatus 500 based on the sensor response function. For example, APE processor 590 can correct the alignment position error by calculating a first center of gravity shift 926 between center of gravity 922 and second diffraction order distribution 924 and a second center of gravity shift 936 between center of gravity 932 and third diffraction order distribution 934. In some embodiments, first and second gravity shifts can calculated as a function of one or more wavelengths of the illumination beam. For example, first and second gravity shifts 926, 936 can be calculated as a function of wavelengths of about 532 nm, 636 nm, 780 nm, and/or 850 nm.

In some embodiments, pupil sensor apparatus 1200 can be an external stand-alone apparatus. In some embodiments, focusing optic 1208 can be the same as second optic 518 and light source 1260 can be the same as illumination beam 504. For example, external pupil sensor apparatus 1200 can include focusing optic 1208 similar to second optic 518 (i.e., shown in FIG. 5) and light source 1260 similar to illumination beam 504 (i.e., shown in FIG. 5) in order to measure and estimate a pupil plane depth distribution 1300 that is equivalent or similar to a pupil plane depth distribution in alignment sensor apparatus 500 (i.e., shown in FIG. 5). In some embodiments, focusing optic 1208 can be different from second optic 518 and light source 1260 can be the same as illumination beam 504. For example, external pupil sensor apparatus 1200 can include focusing optic 1208 different than second optic 518 (i.e., shown in FIG. 5), for example, a different focal length or objective, and light source 1260 similar to illumination beam 504 (i.e., shown in FIG. 5) in order to measure a pupil plane depth distribution 1300 and calibrate a pupil plane depth distribution in alignment sensor apparatus 500 (i.e., shown in FIG. 5) utilizing matching steps to correlate the difference between focusing optic 1208 and second optic 518. In some embodiments, focusing optic 1208 can be different from second optic 518 and light source 1260 can be different from illumination beam 504. For example, external pupil sensor apparatus 1200 can include focusing optic 1208 different than second optic 518 (i.e., shown in FIG. 5), for example, a different focal length or objective, and light source 1260 different than illumination beam 504 (i.e., shown in FIG. 5), for example, a different wavelength, in order to measure a pupil plane depth distribution 1300 and calibrate a pupil plane depth distribution in alignment sensor apparatus 500 (i.e., shown in FIG. 5) utilizing matching steps to correlate the difference between focusing optic 1208 and second optic 518 and the difference between light source 1260 and illumination beam 504.

The embodiments may further be described using the following clauses:

1. An alignment sensor apparatus comprising:
an illumination system configured to transmit an illumination beam along an illumination path;
a first optical system comprising a first optic and a second optic, and configured to transmit the illumination beam toward a diffraction target on a substrate and transmit a signal beam comprising diffraction order sub-beams reflected from the diffraction target along a signal path;
a second optical system comprising a first polarizing optic configured to separate and transmit the signal beam into a first polarization optical branch and a second polarization optical branch based on the polarization of the signal beam;
a detector system comprising one or more detectors, and configured to measure an alignment position of the diffraction target based on the signal beam outputted from the first polarization branch and the second polarization branch;
one or more optical filters disposed along the illumination path and/or the signal path, and configured to adjust one or more physical parameters of the illumination beam and/or the signal beam; and
a processor coupled to the detector system, and configured to measure a change in the alignment position of the diffraction target caused by the one or more optical filters and determine a sensor response function of the alignment sensor apparatus based on the change.

2. The sensor apparatus of clause 1, wherein:
the first polarization optical branch comprises a first polarizing filter, a first self-referencing interferometer, a second polarizing filter, and a second polarizing optic; and
the second polarization optical branch comprises a third polarizing filter, a second self-referencing interferometer, a fourth polarizing filter, and a third polarizing optic.

3. The sensor apparatus of any preceding clause, wherein the processor is further configured to correct an alignment position error of the sensor apparatus based on the sensor response function.

4. The sensor apparatus of clause 3, wherein the processor corrects the alignment position error by calculating a derivative and/or a minimum value of the sensor response function for the one or more physical parameters.

5. The sensor apparatus of any preceding clause, wherein the one or more optical filters is selected from the group consisting of a spectral filter, a numerical aperture filter, a neutral density filter, a patterned filter, and a polarizing filter.

6. The sensor apparatus of clause 5, wherein:
the spectral filter is a narrow passband wavelength filter;
the numerical aperture filter is a lens configured to change an optical power of the illumination beam and/or the signal beam;
the patterned filter is a patterned reference reticle; and
the polarizing filter is a waveplate.

7. The sensor apparatus of any preceding clause, further comprising a third optical system comprising a third optic and a second detector system comprising one or more further detectors, and configured to measure an intensity of the signal beam and/or an asymmetry of the signal beam based on an asymmetry of the diffraction target.

8. A lithographic apparatus comprising:
   a first illumination optical system configured to illuminate a diffraction pattern;
   a projection optical system configured to project an image of the diffraction pattern onto a substrate; and
   an alignment sensor apparatus configured to correct an alignment position error of the lithographic apparatus, the alignment sensor apparatus comprising:
      a second illumination optical system configured to transmit at least one illumination beam of radiation along an illumination path;
      a first optical system comprising a first optic and a second optic, and configured to transmit the illumination beam toward the diffraction pattern on the substrate and transmit a signal beam comprising diffraction order sub-beams reflected from the diffraction pattern along a signal path;
      a second optical system comprising a first polarizing optic configured to separate and transmit the signal beam into a first polarization optical branch and a second polarization optical branch based on the polarization of the signal beam;
      a detector system comprising one or more detectors, and configured to measure an alignment position of the diffraction pattern based on the signal beam outputted from the first polarization branch and the second polarization branch;
      one or more optical filters disposed along the illumination path and/or the signal path, and configured to adjust one or more physical parameters of the illumination beam and/or the signal beam; and
      a processor coupled to the detector system, and configured to measure a change in the alignment position of the diffraction pattern caused by the one or more optical filters and determine a sensor response function of the alignment sensor apparatus based on the change.

9. The lithographic apparatus of clause 8, wherein the processor is further configured to correct an alignment position error of the lithographic apparatus based on the sensor response function.

10. The lithographic apparatus of clause 9, wherein the processor is further configured to calculate a derivative and/or a minimum value of the sensor response function for the one or more physical parameters to thereby correct the alignment position error.

11. The lithographic apparatus of any preceding clause, wherein the one or more optical filters is selected from the group consisting of a spectral filter, a numerical aperture filter, and a polarizing filter.

12. The lithographic apparatus of clause 11, wherein:
   the spectral filter is a narrow passband wavelength filter;
   the numerical aperture filter is a lens configured to change an optical power of the illumination beam and/or the signal beam; and
   the polarizing filter is a half-wave plate or quarter-wave plate.

13. The lithographic apparatus of any preceding clause, wherein the first optical system is configured to transmit the signal beam so as to comprise first and second first diffraction order sub-beams, and wherein the detector system combines the first and second first diffraction order sub-beams to generate a sinusoidal phase.

14. The lithographic apparatus of any preceding clause, wherein the one or more optical filters is a spectral filter, and wherein the processor is configured to determine the sensor response function based on the change between different wavelengths of the illumination beam and/or the signal beam.

15. The lithographic apparatus of any preceding clause, wherein the one or more optical filters is a numerical aperture filter, and wherein the processor is configured to determine the sensor response function based on the change between different diffraction order sub-beams of the signal beam.

16. The lithographic apparatus of any preceding clause, wherein the one or more optical filters is a polarizing filter, and wherein the processor is configured to determine the sensor response function based on the change between different polarizations of the illumination beam and/or the signal beam.

17. A method for correcting alignment position error, comprising:
   measuring, by an alignment sensor apparatus, an alignment position of a diffraction target on a substrate, the alignment sensor apparatus comprising:
      an illumination system configured to transmit an illumination beam along an illumination path;
      a first optical system comprising a first optic and a second optic, and configured to transmit the illumination beam toward the diffraction target on the substrate and transmit a signal beam comprising diffraction order sub-beams reflected from the diffraction target along a signal path;
      a second optical system comprising a first polarizing optic configured to separate and transmit the signal beam into a first polarization optical branch and a second polarization optical branch based on the polarization of the signal beam;
      a detector system comprising one or more detectors, and configured to measure the alignment position of the diffraction target based on the signal beam outputted from the first polarization branch and the second polarization branch; and
      a processor coupled to the detector system;
   adjusting one or more physical parameters of the illumination beam and/or signal beam using one or more optical filters along the illumination path and/or the signal path of the alignment sensor apparatus;
   measuring, by the processor, a change in the alignment position of the diffraction target;
   determining, by the processor, a sensor response function of the alignment sensor apparatus; and
   correcting, by calculating a derivative and/or minimum value of the sensor response function for the one or more physical parameters, an alignment position error of a lithographic apparatus or the alignment sensor apparatus based on the sensor response function.

18. The method of clause 17, wherein adjusting the one or more physical parameters comprises using a spectral filter, and wherein determining the sensor response function comprises measuring the change between different wavelengths of the illumination beam and/or the signal beam.

19. The method of any preceding clause, wherein adjusting the one or more physical parameters comprises using a numerical aperture filter, and wherein determining the sensor response function comprises measuring the change between different diffraction order sub-beams of the signal beam.

20. The method of any preceding clause, wherein adjusting the one or more physical parameters comprises using a polarizing filter, and wherein determining the sensor response function comprises measuring the change between different polarizations of the illumination beam and/or the signal beam.

21. An alignment sensor apparatus comprising:

an illumination system configured to transmit an illumination beam along an illumination path;

a first optical system comprising a first optic and a second optic, and configured to transmit the illumination beam toward a diffraction target on a substrate and transmit an irradiance distribution comprising diffraction order sub-beams reflected from the diffraction target along a signal path;

a second optical system comprising a first polarizing optic configured to separate and transmit the irradiance distribution into a first polarization optical branch and a second polarization optical branch based on the polarization of the irradiance distribution;

a detector system comprising one or more detectors, and configured to measure a center of gravity of the diffraction target based on the irradiance distribution outputted from the first polarization branch and the second polarization branch; and a processor coupled to the detector system, and configured to measure a shift in the center of gravity of the diffraction target caused by an asymmetry variation in the diffraction target and determine a sensor response function of the alignment sensor apparatus based on the center of gravity shift.

22. The sensor apparatus of clause 21, wherein the asymmetry variation in the diffraction target comprises an asymmetric side wall.

23. The sensor apparatus of clause 22, wherein the asymmetric side wall comprises an angled side wall comprising an angle of about 0 degrees to about 10 degrees.

24. The sensor apparatus of clause 21, wherein the asymmetry variation in the diffraction target comprises an asymmetric bottom surface.

25. The sensor apparatus of clause 24, wherein the asymmetric bottom surface comprises an angled bottom surface comprising an angle of about 0 degrees to about 5 degrees.

26. The sensor apparatus of clause 21, wherein the asymmetry variation in the diffraction target comprises an asymmetric top surface.

27. The sensor apparatus of clause 26, wherein the asymmetric top surface comprises an angled top surface comprising an angle of about 0 degrees to about 5 degrees.

28. The sensor apparatus of any preceding clause, wherein the processor is further configured to correct an alignment position error of the sensor apparatus based on the sensor response function.

29. The sensor apparatus of clause 28, wherein the processor corrects the alignment position error by calculating a first center of gravity shift and a second center of gravity shift.

30. The sensor apparatus of clause 29, wherein the first and second center of gravity shifts are calculated as a function of one or more wavelengths of the illumination beam.

31. A pupil sensor apparatus comprising:

an illumination system configured to transmit an illumination beam along an illumination path;

a first optical system comprising a first optic and a second optic, and configured to transmit the illumination beam toward a diffraction target on a substrate and transmit an irradiance distribution comprising diffraction order sub-beams reflected from the diffraction target along a signal path;

a second optical system comprising a first polarizing optic configured to separate and transmit the irradiance distribution into a first polarization optical branch and a second polarization optical branch based on the polarization of the irradiance distribution; and a detector system comprising one or more detectors, and configured to measure a pupil plane depth distribution of the diffraction target based on the irradiance distribution outputted from the first polarization branch and the second polarization branch and a reference irradiance distribution.

32. The pupil sensor apparatus of clause 31, further comprising a processor coupled to the detector system, and configured to measure a shift in the pupil plane depth distribution caused by an asymmetry variation in the diffraction target or a stack thickness variation and determine a sensor response function of the pupil sensor apparatus based on the pupil plane depth distribution shift.

33. The pupil sensor apparatus of clause 32, wherein the processor is further configured to correct an alignment position error of the pupil sensor apparatus based on the sensor response function.

34. The pupil sensor apparatus of clause 33, wherein the processor corrects the alignment position error by calculating a first center of gravity shift and a second center of gravity shift.

35. The pupil sensor apparatus of clause 31, wherein the reference irradiance distribution is based on an aberration map of the detector system.

36. The pupil sensor apparatus of clause 31, wherein the detector system comprises a pupil detector external to the first and second optical systems and configured to measure the pupil plane depth distribution.

37. The pupil sensor apparatus of clause 36, wherein the pupil detector comprises a focusing optic and a light source.

38. The pupil sensor apparatus of clause 37, wherein the focusing optic is the same as the second optic, and wherein the light source is the same as the illumination beam.

39. The pupil sensor apparatus of clause 37, wherein the focusing optic is different from the second optic, and wherein the light source is the same as the illumination beam.

40. The pupil sensor apparatus of clause 37, wherein the focusing optic is different from the second optic, and wherein the light source is different from the illumination beam.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. An alignment sensor apparatus comprising:
   an illumination system configured to transmit an illumination beam along an illumination path;
   a first optical system comprising a first optic and a second optic, and configured to transmit the illumination beam toward a diffraction target on a substrate and transmit a signal beam comprising diffraction order sub-beams reflected from the diffraction target along a signal path;
   a second optical system comprising a first polarizing optic configured to separate and transmit the signal beam into a first polarization optical branch and a second polarization optical branch based on the polarization of the signal beam;
   a detector system comprising one or more detectors, and configured to measure an alignment position of the diffraction target based on the signal beam outputted from the first polarization branch and the second polarization branch;
   one or more optical filters disposed along the illumination path and/or the signal path, and configured to adjust one or more physical parameters of the illumination beam and/or the signal beam; and
   a processor coupled to the detector system, and configured to measure a change in the alignment position of the diffraction target caused by the one or more optical filters and determine a sensor response function of the alignment sensor apparatus based on the change.

2. The sensor apparatus of claim 1, wherein:
   the first polarization optical branch comprises a first polarizing filter, a first self-referencing interferometer, a second polarizing filter, and a second polarizing optic; and
   the second polarization optical branch comprises a third polarizing filter, a second self-referencing interferometer, a fourth polarizing filter, and a third polarizing optic.

3. The sensor apparatus of claim 1, wherein the processor is further configured to correct an alignment position error of the sensor apparatus based on the sensor response function.

4. The sensor apparatus of claim 3, wherein the processor corrects the alignment position error by calculating a derivative and/or a minimum value of the sensor response function for the one or more physical parameters.

5. The sensor apparatus of claim 1, wherein the one or more optical filters is selected from the group consisting of a spectral filter, a numerical aperture filter, a neutral density filter, a patterned filter, and a polarizing filter.

6. The sensor apparatus of claim 5, wherein:
the spectral filter is a narrow passband wavelength filter;
the numerical aperture filter is a lens configured to change an optical power of the illumination beam and/or the signal beam;
the patterned filter is a patterned reference reticle; and
the polarizing filter is a waveplate.

7. The sensor apparatus of claim 1, further comprising a third optical system comprising a third optic and a second detector system comprising one or more further detectors, and configured to measure an intensity of the signal beam and/or an asymmetry of the signal beam based on an asymmetry of the diffraction target.

8. A lithographic apparatus comprising:
a first illumination optical system configured to illuminate a diffraction pattern;
a projection optical system configured to project an image of the diffraction pattern onto a substrate; and
an alignment sensor apparatus configured to correct an alignment position error of the lithographic apparatus, the alignment sensor apparatus comprising:
a second illumination optical system configured to transmit at least one illumination beam of radiation along an illumination path;
a first optical system comprising a first optic and a second optic, and configured to transmit the illumination beam toward the diffraction pattern on the substrate and transmit a signal beam comprising diffraction order sub-beams reflected from the diffraction pattern along a signal path;
a second optical system comprising a first polarizing optic configured to separate and transmit the signal beam into a first polarization optical branch and a second polarization optical branch based on the polarization of the signal beam;
a detector system comprising one or more detectors, and configured to measure an alignment position of the diffraction pattern based on the signal beam outputted from the first polarization branch and the second polarization branch;
one or more optical filters disposed along the illumination path and/or the signal path, and configured to adjust one or more physical parameters of the illumination beam and/or the signal beam; and
a processor coupled to the detector system, and configured to measure a change in the alignment position of the diffraction pattern caused by the one or more optical filters and determine a sensor response function of the alignment sensor apparatus based on the change.

9. The lithographic apparatus of claim 8, wherein the processor is further configured to correct an alignment position error of the lithographic apparatus based on the sensor response function.

10. The lithographic apparatus of claim 9, wherein the processor is further configured to calculate a derivative and/or a minimum value of the sensor response function for the one or more physical parameters to thereby correct the alignment position error.

11. The lithographic apparatus of claim 8, wherein the one or more optical filters is selected from the group consisting of a spectral filter, a numerical aperture filter, and a polarizing filter.

12. The lithographic apparatus of claim 11, wherein:
the spectral filter is a narrow passband wavelength filter;
the numerical aperture filter is a lens configured to change an optical power of the illumination beam and/or the signal beam; and
the polarizing filter is a half-wave plate or quarter-wave plate.

13. The lithographic apparatus of claim 8, wherein the first optical system is configured to transmit the signal beam so as to comprise first and second first diffraction order sub-beams, and wherein the detector system combines the first and second first diffraction order sub-beams to generate a sinusoidal phase.

14. The lithographic apparatus of claim 8, wherein the one or more optical filters is a spectral filter, and wherein the processor is configured to determine the sensor response function based on the change between different wavelengths of the illumination beam and/or the signal beam.

15. The lithographic apparatus of claim 8, wherein the one or more optical filters is a numerical aperture filter, and wherein the processor is configured to determine the sensor response function based on the change between different diffraction order sub-beams of the signal beam.

16. The lithographic apparatus of claim 8, wherein the one or more optical filters is a polarizing filter, and wherein the processor is configured to determine the sensor response function based on the change between different polarizations of the illumination beam and/or the signal beam.

17. An alignment sensor apparatus comprising:
an illumination system configured to transmit an illumination beam along an illumination path;
a first optical system comprising a first optic and a second optic, and configured to transmit the illumination beam toward a diffraction target on a substrate and transmit an irradiance distribution comprising diffraction order sub-beams reflected from the diffraction target along a signal path;
a second optical system comprising a first polarizing optic configured to separate and transmit the irradiance distribution into a first polarization optical branch and a second polarization optical branch based on the polarization of the irradiance distribution;
a detector system comprising one or more detectors, and configured to measure a center of gravity of the diffraction target based on the irradiance distribution outputted from the first polarization branch and the second polarization branch; and
a processor coupled to the detector system, and configured to measure a shift in the center of gravity of the diffraction target caused by an asymmetry variation in the diffraction target and determine a sensor response function of the alignment sensor apparatus based on the center of gravity shift.

18. The sensor apparatus of claim 17, wherein the asymmetry variation in the diffraction target comprises an asymmetric side wall.

19. The sensor apparatus of claim 18, wherein the asymmetric side wall comprises an angled side wall comprising an angle of about 0 degrees to about 10 degrees.

20. The sensor apparatus of claim 17, wherein the asymmetry variation in the diffraction target comprises an asymmetric bottom surface.

21. The sensor apparatus of claim 20, wherein the asymmetric bottom surface comprises an angled bottom surface comprising an angle of about 0 degrees to about 5 degrees.

22. The sensor apparatus of claim 17, wherein the asymmetry variation in the diffraction target comprises an asymmetric top surface.

23. The sensor apparatus of claim 22, wherein the asymmetric top surface comprises an angled top surface comprising an angle of about 0 degrees to about 5 degrees.

24. The sensor apparatus of claim 17, wherein the processor is further configured to correct an alignment position error of the sensor apparatus based on the sensor response function.

25. The sensor apparatus of claim 24, wherein the processor corrects the alignment position error by calculating a first center of gravity shift and a second center of gravity shift.

26. The sensor apparatus of claim 25, wherein the first and second center of gravity shifts are calculated as a function of one or more wavelengths of the illumination beam.

27. A pupil sensor apparatus comprising:
an illumination system configured to transmit an illumination beam along an illumination path;
a first optical system comprising a first optic and a second optic, and configured to transmit the illumination beam toward a diffraction target on a substrate and transmit an irradiance distribution comprising diffraction order sub-beams reflected from the diffraction target along a signal path;
a second optical system comprising a first polarizing optic configured to separate and transmit the irradiance distribution into a first polarization optical branch and a second polarization optical branch based on the polarization of the irradiance distribution; and
a detector system comprising one or more detectors, and configured to measure a pupil plane depth distribution of the diffraction target based on the irradiance distribution outputted from the first polarization branch and the second polarization branch and a reference irradiance distribution.

28. The pupil sensor apparatus of claim 27, further comprising a processor coupled to the detector system, and configured to measure a shift in the pupil plane depth distribution caused by an asymmetry variation in the diffraction target or a stack thickness variation and determine a sensor response function of the pupil sensor apparatus based on the pupil plane depth distribution shift.

29. The pupil sensor apparatus of claim 28, wherein the processor is further configured to correct an alignment position error of the pupil sensor apparatus based on the sensor response function.

30. The pupil sensor apparatus of claim 29, wherein the processor corrects the alignment position error by calculating a first center of gravity shift and a second center of gravity shift.

31. The pupil sensor apparatus of claim 27, wherein the reference irradiance distribution is based on an aberration map of the detector system.

32. The pupil sensor apparatus of claim 27, wherein the detector system comprises a pupil detector external to the first and second optical systems and configured to measure the pupil plane depth distribution.

33. The pupil sensor apparatus of claim 32, wherein the pupil detector comprises a focusing optic and a light source.

34. The pupil sensor apparatus of claim 33, wherein the focusing optic is the same as the second optic, and wherein the light source is the same as the illumination beam.

35. The pupil sensor apparatus of claim 33, wherein the focusing optic is different from the second optic, and wherein the light source is the same as the illumination beam.

36. The pupil sensor apparatus of claim 33, wherein the focusing optic is different from the second optic, and wherein the light source is different from the illumination beam.

37. The sensor apparatus of claim 1, wherein the one or more optical filters is disposed along the illumination path and/or the signal path after the detector system measures the alignment position.

38. The lithographic apparatus of claim 8, wherein the one or more optical filters is disposed along the illumination path and/or the signal path after the detector system measures the alignment position.

* * * * *